(12) United States Patent
Chang et al.

(10) Patent No.: US 10,971,646 B2
(45) Date of Patent: Apr. 6, 2021

(54) CHEMICAL VAPOR DEPOSITION EQUIPMENT FOR SOLAR CELL AND DEPOSITION METHOD THEREOF

(71) Applicant: LG ELECTRONICS INC., Seoul (KR)

(72) Inventors: Wonjae Chang, Seoul (KR); Junyong Ahn, Seoul (KR); Hyunho Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/520,014

(22) Filed: Jul. 23, 2019

(65) Prior Publication Data

US 2020/0035852 A1    Jan. 30, 2020

(30) Foreign Application Priority Data

Jul. 24, 2018    (KR) .................. 10-2018-0086238
Sep. 28, 2018    (KR) .................. 10-2018-0116437
Sep. 28, 2018    (KR) .................. 10-2018-0116446

(51) Int. Cl.
*H01L 31/18* (2006.01)
*C23C 16/24* (2006.01)
*C23C 16/455* (2006.01)
*C23C 16/458* (2006.01)

(52) U.S. Cl.
CPC ............ *H01L 31/182* (2013.01); *C23C 16/24* (2013.01); *C23C 16/4587* (2013.01); *C23C 16/45565* (2013.01); *H01L 31/1864* (2013.01)

(58) Field of Classification Search
CPC ................ H01L 31/182; H01L 31/1864; H01L 21/02573; H01L 21/02532; H01L 21/02595; H01L 21/0262; H01L 21/02381; C23C 16/24; C23C 16/45565; C23C 16/4587; C23C 16/45508; C23C 16/45574; C23C 16/56; C23C 16/45512; C23C 16/45578; C23C 16/4558
USPC ........................................................ 438/488
See application file for complete search history.

(56) References Cited

U.S. PATENT DOCUMENTS

| 5,326,722 A * | 7/1994 | Huang .............. H01L 21/28525 |
| | | 257/E21.166 |
| 5,607,724 A * | 3/1997 | Beinglass ................ C23C 16/24 |
| | | 427/255.393 |
| 7,718,518 B2 * | 5/2010 | Zagwijn .............. H01L 21/0262 |
| | | 438/488 |

(Continued)

FOREIGN PATENT DOCUMENTS

| EP | 0 335 421 A2 | 10/1989 |
| EP | 1209726 A2 | 5/2002 |

(Continued)

*Primary Examiner* — Vu A Vu
(74) *Attorney, Agent, or Firm* — Birch, Stewart, Kolasch & Birch, LLP

(57) ABSTRACT

Provided is a Chemical vapor deposition (CVD) equipment including a chamber having an inner space, a plurality of silicon wafers disposed in the inner space of the chamber in an upright position; and a plurality of shower nozzles configured to inject a mixed gas composed of a silicon deposition gas and an impurity gas toward each side edge of the plurality of wafers. The plurality of shower nozzles can be disposed at both sides of the plurality of the plurality of silicon wafers.

11 Claims, 21 Drawing Sheets

(a)

(b)

(56) References Cited

U.S. PATENT DOCUMENTS

| | | | |
|---|---|---|---|
| 9,410,247 B2 * | 8/2016 | Lee | .................. C23C 16/45578 |
| 2003/0049372 A1 * | 3/2003 | Cook | ................ H01L 21/67017 |
| | | | 427/248.1 |
| 2007/0006800 A1 * | 1/2007 | Lee | ..................... C23C 16/4408 |
| | | | 117/95 |
| 2007/0141812 A1 | 6/2007 | Zagwijn et al. | |
| 2010/0029089 A1 | 2/2010 | Maeda et al. | |
| 2010/0035440 A1 | 2/2010 | Fukuda et al. | |
| 2013/0098293 A1 | 4/2013 | Lee et al. | |
| 2017/0051409 A1 | 2/2017 | Noh et al. | |
| 2017/0253969 A1 | 9/2017 | Inaba et al. | |

FOREIGN PATENT DOCUMENTS

| | | |
|---|---|---|
| EP | 2 407 577 A2 | 1/2012 |
| JP | 1-160827 U | 11/1989 |
| JP | 4-350927 A | 12/1992 |
| JP | 9-97766 A | 4/1997 |
| JP | 10-12559 A | 1/1998 |
| JP | 2004-48068 A | 2/2004 |
| JP | 2017-17323 A | 1/2017 |
| KR | 10-2007-0032530 A | 3/2007 |
| KR | 10-1806966 B1 | 12/2017 |
| KR | 10-2018-0057537 A | 5/2018 |

\* cited by examiner (a)

(b)

(a)

(b)

(a)

(b)

(a)

(b)

(a)

(b)

(a)

(b)

$$G1a < G1b, \quad \frac{1}{17} < \frac{G2a + G2b + G2c}{G1a + G1b} < \frac{2}{17}, \quad G2b > G2a, G2c$$

CHEMICAL VAPOR DEPOSITION EQUIPMENT FOR SOLAR CELL AND DEPOSITION METHOD THEREOF

CROSS-REFERENCE TO RELATED APPLICATIONS

This application claims priority to and the benefit of Korean Patent Application No. 10-2018-0086238 filed in the Korean Intellectual Property Office on Jul. 24, 2018, Korean Patent Application No. 10-2018-0116437 filed in the Korean Intellectual Property Office on Sep. 28, 2018, and Korean Patent Application No. 10-2018-0116446 filed in the Korean Intellectual Property Office on Sep. 28, 2018, all of these applications are fully incorporated by reference into the present application.

BACKGROUND OF THE INVENTION

Field of the Invention

The present invention relates to chemical vapor deposition equipment for solar cells and a deposition method thereof.

Related Art

Since conventional energy resources such as oil or coal are expected to be depleted, interest in alternative energy resources to replace the existing energy resources is growing these days. Among them, solar cells produce electric energy from solar energy and getting great attention because of their abundant energy source, free of environmental pollution.

A typical solar cell comprises a substrate made of semiconductors of different conductive types such as p-type and n-type; emitter layer; and electrodes connected respectively to the substrate and emitter layer. At this time, p-n junctions are formed on the interface between the substrate and emitter layer.

If light is incident on the solar cell, a plurality of electron-hole pairs are generated in the semiconductor, and the generated electron-hole pairs are separated into electrons and holes. The electrons and holes move to n-type and p-type semiconductors, for example, emitter layer and substrate, and are collected by electrodes connected electrically to the substrate and emitter layer. The electrodes are connected by wire to obtain power.

Recently, to improve the open circuit voltage ($V_{oc}$) of a solar cell, solar cells based on a silicon deposition structure containing impurities on the silicon semiconductor substrate surface thereof are under development.

However, for a solar cell based on the aforementioned structure to obtain desired efficiency and open-circuit voltage, thickness of the polycrystalline silicon layer deposited on the surface of the solar cell has to be uniform.

However, if impurity gas is not uniformly distributed when a polycrystalline silicon layer containing impurities is deposited on the surface of a semiconductor substrate of a solar cell, a deposition rate of a polycrystalline silicon layer on the semiconductor substrate differs locally on the silicon substrate, thickness of the polycrystalline silicon layer deposited on the semiconductor substrate becomes non-uniform, and thereby efficiency of the solar cell can be degraded or efficiency and open-circuit voltage may not be achieved as much as desired.

SUMMARY OF THE INVENTION

The present invention provides chemical vapor deposition equipment for depositing a doped polycrystalline silicon layer for a solar cells capable of improving uniformity of thickness of a polycrystalline silicon layer containing impurities on a semiconductor substrate surface; and a deposition method for driving the equipment.

Chemical vapor deposition equipment for depositing a doped polycrystalline silicon layer for a solar cells according to one embodiment of the present invention includes a chamber having an inner space, a plurality of silicon wafers disposed vertically in the inner space of the chamber; and a plurality of shower nozzles configured to inject a mixed gas composed of a silicon deposition gas and an impurity gas toward side edges of the plurality of wafers.

The plurality of shower nozzles can be disposed at both sides of the plurality of the plurality of silicon wafers.

Each of the plurality of shower nozzles can has a plurality of holes to inject the mixed gas.

The CVD equipment can further comprises a flow rate control unit for controlling the flow rate of the silicon deposition gas and the impurity gas, respectively, and supplying the mixed gas to the plurality of shower nozzles.

The flow rate control unit can selectively supplies the silicon deposition gas without the impurity gas to the plurality of shower nozzles.

The inner space can be elongated in a first direction, a door through which the plurality of wafers is able to enter and exit can be installed at a front side of the chamber along the first direction, a vent through which gas is able to escape can be installed at a rear side of the chamber along the first direction, and the plurality of shower nozzles can be located between the a chamber wall and side edges of the plurality of wafers.

Each of the plurality of shower nozzles extends in the first direction from the outside to the inside of the chamber and is connected to a pipe supplying the mixed gas, where the pipe need not have holes.

Each of the plurality of shower nozzles can be connected to an end of the pipe and can be elongated in the second direction intersecting the first direction along a wall surface of the chamber around the plurality of silicon wafers.

Each of the plurality of shower nozzles can has a round shape in the second direction along the wall surface of the chamber from the end of the pipe, and the plurality of holes can be provided being separated from each other in a longitudinal direction of the each of the plurality of shower nozzles.

The opening directions of the plurality of holes can be directed to a center of the inner space of the chamber from the surface of the each of the plurality of shower nozzles.

The end of the shower nozzle can be located close to the end of the pipe along the wall surface of the chamber body.

The CVD equipment can further comprises a boat disposed in the chamber and elongated in the first direction. The plurality of silicon wafers can be disposed vertically and arranged in a horizontal direction in the boat.

Here, the plurality of shower nozzles can include a first sub-shower nozzle injecting a mixed gas on the front portion of the boat adjacent to the door side; a second sub-shower nozzle injecting the mixed gas on the central portion of the boat; and a third sub-shower nozzle injecting a mixed gas on the rear portion of the boat adjacent to the vent.

A deposition method according to one embodiment of the present invention can include placing a plurality of wafers vertically in a chamber of the CVD equipment; and depositing a doped polycrystalline silicon layer on each of the plurality of silicon wafer by injecting a mixed gas composed of a silicon deposition gas and an impurity gas from a plurality of shower nozzles toward side edges of the plurality of the silicon wafers.

A deposition method according to one embodiment of the present invention can further include depositing an un-doped polycrystalline silicon layer by injecting the silicon deposition gas without the impurity gas.

A deposition method according to one embodiment of the present invention can further include a heat treatment process for activating impurities of the doped polycrystalline silicon layer, and the un-doped polycrystalline silicon layer can be doped with the impurities of the doped crystalline silicon layer.

When the doped polycrystalline silicon layer is deposited, the flow rate of the silicon deposition gas and the impurity gas can be adjusted so as to mix the silicon deposition gas and the impurity gas at an appropriate ratio, and the silicon deposition gas and the impurity gas can be simultaneously supplied to the plurality of shower nozzles.

A deposition temperature of the doped polycrystalline silicon layer can be lower than a deposition temperature of the un-doped polycrystalline silicon layer.

A thickness of the doped polycrystalline silicon layer can be smaller than a thickness of the un-doped polycrystalline silicon layer.

A deposition method according to one embodiment of the present invention can include placing a plurality of wafers vertically in a chamber of the CVD equipment; depositing a first un-doped polycrystalline silicon layer on each of the plurality of wafers by injecting a silicon deposition gas from a shower nozzle to side edges of the plurality of wafers; depositing a doped polycrystalline silicon layer on the first un-doped polycrystalline silicon layer by injecting a mixed gas composed of a silicon deposition gas and an impurity gas from a shower nozzle toward side edges of the plurality of wafers; and depositing a second un-doped polycrystalline silicon layer on the doped polycrystalline silicon layer by injecting the silicon deposition gas from the shower nozzle to the side edges of the plurality of wafers.

A deposition method according to one embodiment of the present invention can further include a heat treatment process for activating impurities of the doped polycrystalline silicon layer, and the first and second un-doped polycrystalline silicon layers can be doped with the impurities of the doped polycrystalline silicon layer.

Each of the plurality of wafers is loaded into the chamber while being loaded vertically on a boat.

DESCRIPTION OF EXEMPLARY EMBODIMENTS

In what follows, embodiments of the present invention will be described in detail with reference to appended drawings so that those skilled in the art to which the present invention belongs can readily apply the present invention. However, the present invention can be implemented in various other forms and is not limited to a specific embodiment described in this document. Moreover, to describe the present invention without ambiguity, those elements not related to the description of the present invention have been omitted, and throughout the document, similar elements are given a similar reference symbol number.

To illustrate various layers and areas clearly, thickness of each element has been magnified in the corresponding figure. If a part such as a layer, membrane, area, or plate is said to lie "on" a different element, it indicates not only a case where a part is "right on" the different part but also a case where a third element lies between the two parts. On the other hand, if a part is said to lie "right on" a different part, it indicates that there is no other part lying between the two parts. Also, if a part is said to be formed "over all of" a different part, it indicates a case where the part is formed over the whole surface (or front surface) of the different part but also a case where the part is not formed over some of boundary areas.

Moreover, in what follows, considering the process error, if thickness, width, or length of some constituting element is said to be the same with each other, it indicates a case where thickness, width, or length of some first constituting element falls within 10% of error tolerance when compared with thickness, width, or length of another second constituting element.

Figure 1:
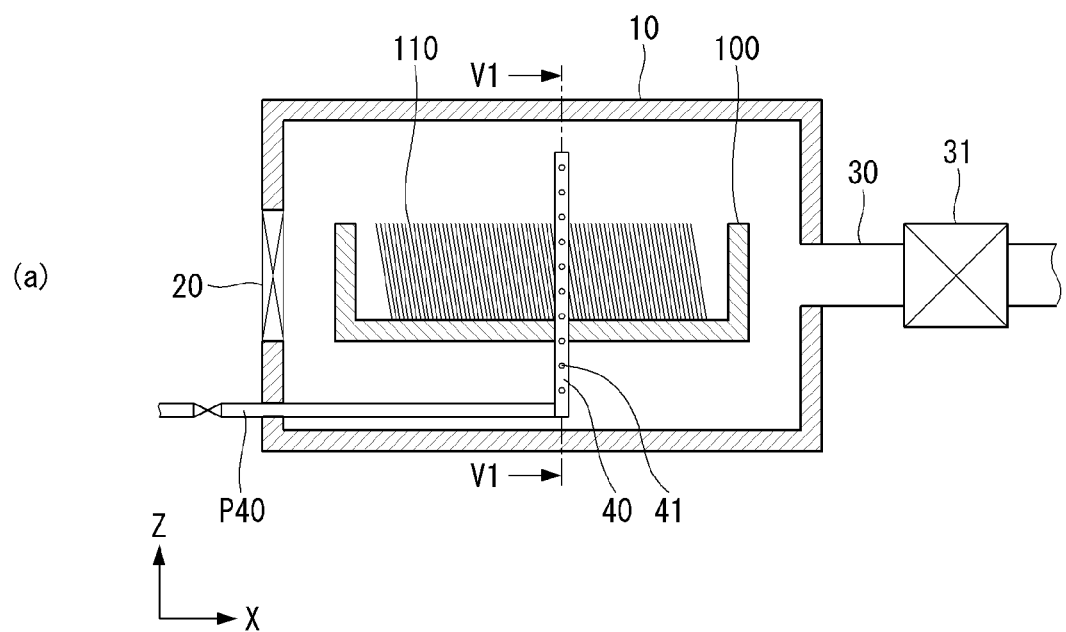
FIGS. 1 and 2 illustrate a first embodiment of chemical vapor deposition equipment for solar cells according to the present invention.
Figure 1:
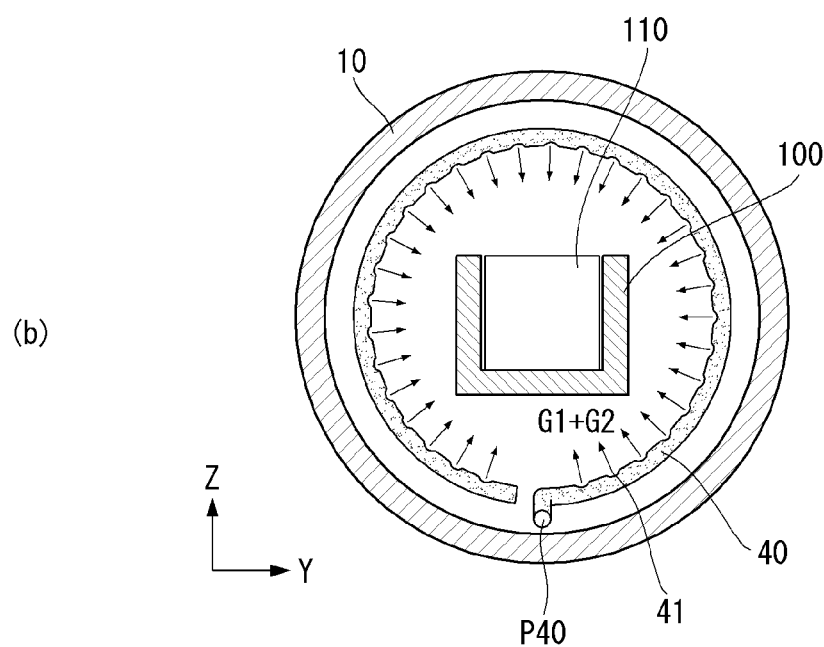
Figure 2:
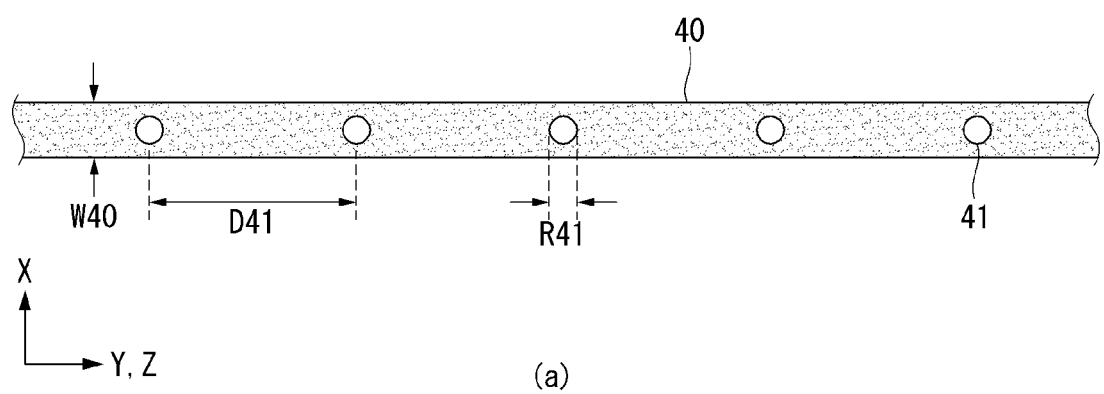
Figure 2:
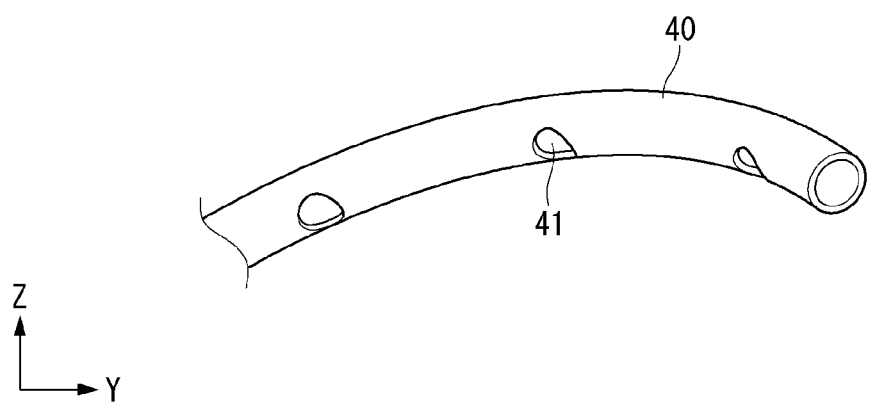

FIGS. 1 and 2 illustrate a first embodiment of chemical vapor deposition equipment for solar cells according to the present invention.

In FIG. 1, (a) illustrates a cross-sectional view of chemical vapor deposition equipment for solar cells when it is viewed from the side, and in FIG. 1, (b) illustrates a cross-sectional view of chemical vapor deposition equipment for solar cells when it is viewed from the front.

FIG. 2 is intended to illustrate a shower nozzle 40 installed within chemical vapor deposition equipment for solar cells, where (a) of FIG. 2 illustrates the shower nozzle 40 when viewed from the center of chemical vapor deposition equipment, and (b) of FIG. 2 illustrates part of a perspective view of the shower nozzle 40.

As shown in FIGS. 1 and 2, a chemical vapor deposition equipment for solar cells according to the present invention is equipped with a chamber 10 and a shower nozzle 40.

As shown in (a) of FIG. 1, the chamber can comprise inner space which elongates in the horizontal direction (x), and in which a plurality of silicon wafers 110 are disposed and a wall which forms an enclosed space. The horizontal direction is a first direction.

More specifically, as shown in (a) and (b) of FIG. 1, the chamber 10 can be elongated in the horizontal direction (x); and can be installed with a door at the front of the chamber 10 in the horizontal direction (x) and with a vent 30 and a vacuum pump 31 at the rear of the chamber 10 in the horizontal direction (x).

A plurality of silicon wafers 110 can be disposed within a boat 100 which extends in the horizontal direction (x) inside the chamber 10, and the silicon wafers for solar cells 110 can be loaded or unloaded to and from the chamber 10 through the door 20 while being disposed within the boat 100.

As shown in (a) of FIG. 1, a plurality of silicon wafers 110 can be disposed in the inner space of the chamber 10 by being located in the upright position (z) separated horizontally (x) from the boat 100 elongated in the horizontal direction (x).

Accordingly, as shown in (a) of FIG. 1, a plurality of silicon wafers 110 can be disposed by being separated from the boat 100 horizontally (x) within the boat 100 so that the surfaces of the plurality of silicon wafers 110 face the door 20 or vent 30 in the horizontal direction (x).

The aforementioned structure of disposing a plurality of silicon wafers within the boat 100 can significantly increase the number of silicon wafers 110 on which polycrystalline silicon layers can be deposited in one fell swoop.

As one example, in an ordinary semiconductor manufacturing process other than a semiconductor process for solar cells, the number of wafers 110 on which a certain layer can be deposited at the same time ranges at most from 100 to 200; however, when silicon wafers 110 are disposed in their upright position within the boat 100 as shown in FIG. 1, the number of silicon wafers 110 on which polycrystalline silicon layers can be deposited simultaneously is increased up to 800 to 1000.

Also, although FIG. 1 illustrates a case where only one boat 100 is loaded into the chamber 10, the number of boats 100 can be plural.

Also, although FIG. 1 illustrates a case where a boat 100 is elongated in the horizontal direction (x) inside the chamber 10, it is also possible that the boat 100 is extended in the vertical direction (z) inside the chamber 10 while the boat 100 is put in the upright position.

Here, when a boat 100 which holds a plurality of silicon wafers 110 is loaded and disposed inside the chamber 10, the end portion of the boat 100 in the horizontal direction (x) adjacent to the door 20 inside the chamber 10 can be defined as a front portion of the boat 100, the end portion of the boat 100 adjacent to the vent 30 in the horizontal direction (x) as a rear portion of the boat 100, and the portion of the boat 100 between the front and the rear portion as a central portion.

Also, the vent 30 and the vacuum pump 31 installed in the rear portion of the chamber 10 can discharge the gas injected through the shower nozzle 40 to the outside of the chamber 10.

The shower nozzle 40 can perform the function of injecting a mixed gas (G1+G2) composed of a silicon deposition gas (G1) which deposits a polycrystalline silicon layer toward the side surface of a plurality of silicon wafers 110 and an impurity gas (G2) doped within the deposited polycrystalline silicon layer.

To this purpose, the shower nozzle 40 can be fixed inside the chamber 10 and can have holes 41 which inject a mixed gas (G1+G2) composed of a silicon deposition gas (G1) which deposits a polycrystalline silicon layer on each surface of a plurality of silicon wafers 110 and an impurity gas (G2) doped within the deposited polycrystalline silicon layer.

Therefore, the shower nozzle 40 can be located between the chamber 10 and a plurality of silicon wafers 110 and inject a mixed gas (G1+G2) toward the side surface of the plurality of silicon wafers 110.

More specifically, the shower nozzle 40 can be extended in the horizontal direction (x) from the outside to the inside of the chamber 10 and connected to a pipe P40 which supplies a mixed gas (G1+G2). Here, the pipe P40 need not have holes 41.

Here, the shower nozzle 40 can be connected to the end of the pipe P40 and elongated in the vertical direction (z) intersecting the horizontal direction (x) along the wall surface of the chamber 10 around a plurality of silicon wafers 110. The vertical direction is a second direction. The shower nozzle 40 can have a round shape in the vertical direction (z) along the wall surface of the chamber 10 from the end of the pipe P40.

In other words, as shown in (b) of FIG. 1, the shower nozzle 40 can be elongated along the wall surface of the chamber 10 around the center of the inner space thereof to form a round tube shape.

As described above, a plurality of holes 41 can be provided by being separated from each other along the longitudinal direction of the shower nozzle 40. At this time, the opening directions of a plurality of holes 41 can be directed to the center of the inner space of the chamber 10 from the surface of the shower nozzle. However, the present invention is not necessarily limited to the specific disposition, but it is also possible that the opening of the first hole 41 is directed to be slightly displaced toward the front or rear surface of the chamber 10.

Moreover, the end portion of the shower nozzle 40 can be located close to the end of the pipe P40 along the wall surface of the chamber or can be blocked.

As described above, since the shower nozzle 40 is installed in a round shape along the wall surface of the chamber 10 and injects a mixed gas (G1+G2) toward the side surface of the semiconductor wafer 110, the mixed gas (G1+G2) can be deposited more uniformly on the front or rear surface of the semiconductor wafer 110.

Here, the diameter W40 of the shower nozzle 40 can be formed to range from 3 mm to 7 mm.

Also, the spacing D41 between holes 41 installed in the shower nozzle 40 can be formed uniformly within a range of 20 mm to 80 mm by considering the distribution of a mixed gas (G1+G2) or can be formed in an irregular pattern.

FIG. 1 illustrates an example where the spacing D41 between holes 41 installed in the shower nozzle 40 is kept to be uniform.

Moreover, the diameter R41 of each of the holes 41 installed in the shower nozzle 40 can range from 0.5 mm to 2.5 mm.

Of the mixed gas (G1+G2) introduced to the shower nozzle 40 as described above, the silicon deposition gas (G1) can be injected on the surface of a silicon wafer 110 for solar cells to be deposited as a polycrystalline silicon layer. In one example, the silicon deposition gas (G1) can be Silane (SiH4) gas.

Moreover, of the mixed gas (G1+G2) introduced into the shower nozzle 40, the impurity gas (G2) can be doped within a polycrystalline silicon layer when the polycrystalline silicon layer is deposited on the surface of the silicon wafer 110 for solar cells.

As one example, the impurity gas (G2) can be PH3 gas, but the present invention is not necessarily limited to the specific type of gas, and Boron gas such as BBr3 can also be used.

Therefore, a mixed gas (G1+G2) introduced from the outside to the shower nozzle 40 is injected through the holes 41 of the shower nozzle 40. The injected mixed gas (G1+G2) can form a convection flow to be discharged while moving from the front portion adjacent to the door 20 within the space of the deposition equipment to the rear portion of the vent 30.

At this time, part of the mixed gas (G1+G2) can be deposited on the surface of the silicon wafer 110 as a polycrystalline silicon layer doped with impurities, and the remaining part can be sucked by the vacuum pipe 31 and discharged through the vent 30.

As described above, the chemical vapor deposition equipment for solar cells according to one embodiment of the present invention injects the silicon deposition gas (G1) and impurity gas (G2) together through each shower nozzle 40, thereby improving uniformity of thickness of doped polycrystalline silicon layers deposited on the surface of the silicon wafers 110.

In addition, since the shower nozzle 40 is constructed so that a plurality of silicon wafers 110 are disposed in the center, and a mixed gas (G1+G2) is injected to the side surface of the silicon wafer 110, polycrystalline silicon layers can be formed on the side surface of the silicon wafer 110 in a more uniform manner.

Although the first embodiment of the present invention has been described with respect to an example where only one shower nozzle 40 is installed in the central part of the boat 100, it is also possible that a plurality of shower nozzles 40 are installed at the front, center, and rear portion of the boat 100, respectively.

Figure 3:
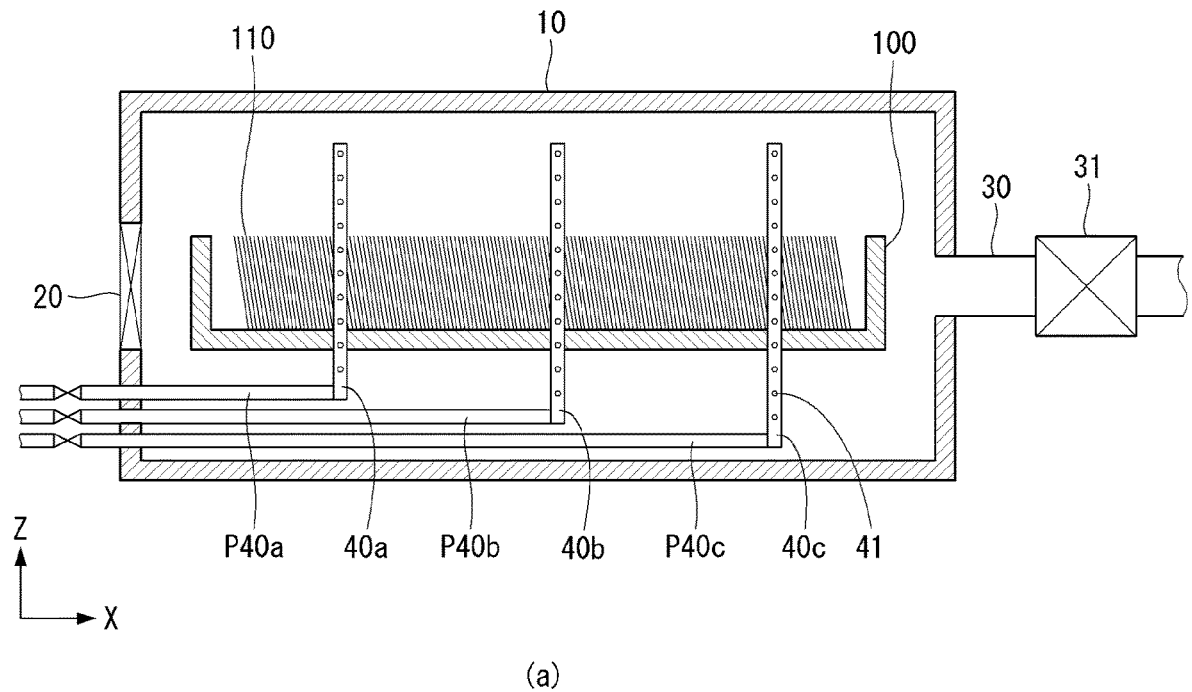
FIG. 3 illustrates a second embodiment of chemical vapor deposition equipment for solar cells according to the present invention.
Figure 3:
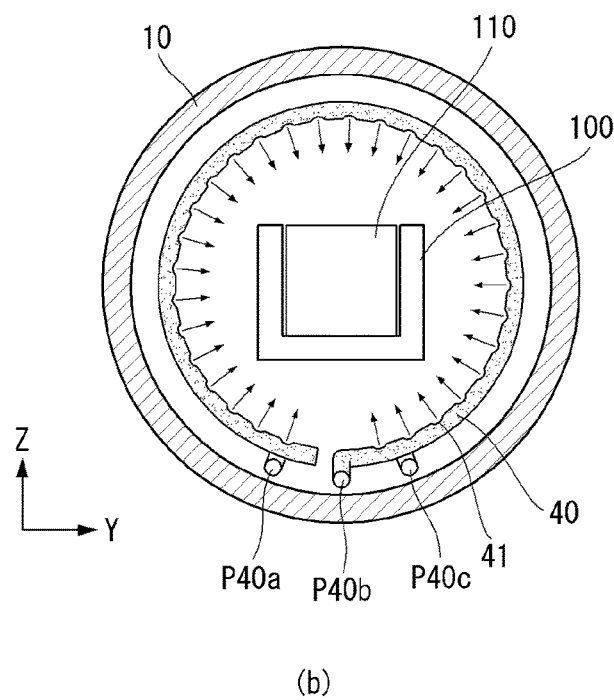

FIG. 3 illustrates a second embodiment of chemical vapor deposition equipment for solar cells according to the present invention.

(a) of FIG. 3 illustrates a cross-sectional view of chemical vapor deposition equipment for solar cells when it is viewed from the side, and (b) of FIG. 3 illustrates a cross-sectional view of chemical vapor deposition equipment for solar cells when it is viewed from the front.

(a) of FIG. 3 assumes that a first, second, and third pipe P40a, P40b, P40c have a different height from the wall body of the chamber, and a first, second, and third shower nozzle 40a, 40b, 40c have a different size from each other. However, the structure of (a) of FIG. 3 is only an example introduced for the convenience of understanding; in fact, as shown in (b) of FIG. 3, distances from the wall body of the chamber to the first, second, and third pipe P40a, P40b, P40c are actually the same; and sizes of the first, second, and third shower nozzle 40a, 40b, 40c can be the same with each other.

As shown in (a) of FIG. 3, chemical vapor deposition equipment for solar cells according to the second embodiment can have a shower nozzle 40 at the front, center, and rear portion of the boat 100, respectively.

To this purpose, a plurality of pipes P40a, P40b, P40c can be connected to the respective shower nozzles 40a, 40b, 40c.

As described above, since a plurality of shower nozzles 40a, 40b, 40c are installed respectively at the front, center, and rear portion of the boat 100, and each shower nozzle 40a, 40b, 40c injects a mixed gas (G1+G2) to the side surface of a silicon substrate, a polycrystalline silicon layer can be deposited on the surface of the silicon substrate in a more uniform manner.

Also, although a boat 100 is elongated in the horizontal direction (x) inside the chamber 10 in the chemical vapor deposition equipment for solar cells according to the first and second embodiment of the present invention, it is also possible that the boat 100 is extended in the horizontal direction (x) inside the chamber 10 while the boat 100 is put in the upright position.

Figure 4:
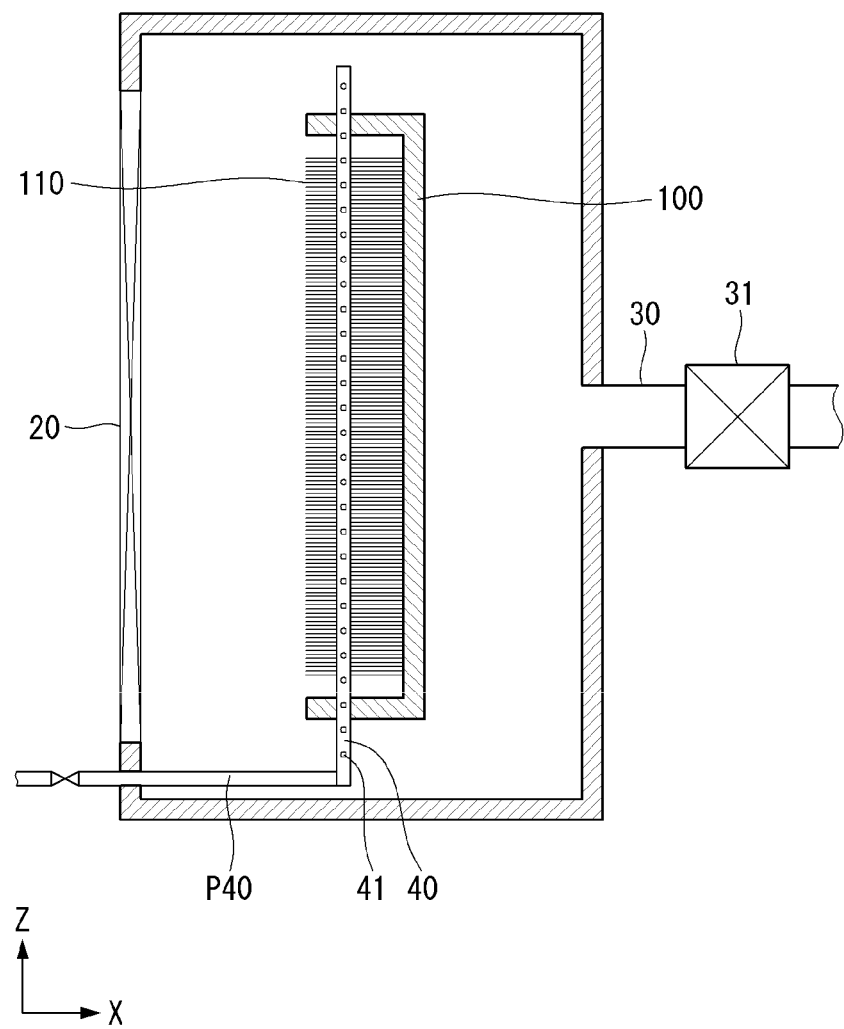
FIG. 4 illustrates a third embodiment of chemical vapor deposition equipment for solar cells according to the present invention.

FIG. 4 illustrates a third embodiment of chemical vapor deposition equipment for solar cells according to the present invention.

In the chemical vapor deposition equipment according to the third embodiment of the present invention, the structure of a shower nozzle 40 and pipe P40 can be the same as described in the first embodiment.

Differently from the first embodiment, however, in the chemical vapor deposition equipment for solar cells according to the third embodiment of the present invention, the height of a chamber 10 in the vertical direction (z) and the diameter thereof can be much longer than the length of the chamber 10 in the horizontal direction (x). In other words, the diameter of the chamber 10 can be much larger than the length of the chamber 10 in the horizontal direction (x).

As shown in FIG. 4, while the diameter of the chamber 10 is much larger than the length of the chamber 10 in the horizontal direction (x), a plurality of silicon wafers 110 can be disposed in the inner space of the chamber 10 so that the plurality of silicon wafers 110 are separated from each other in the vertical direction (z) in a boat 100 elongated in the vertical direction (z) and are placed in the lying-down position along a first horizontal direction (x).

In other words, a boat 100 in which a plurality of silicon wafers 110 are disposed can be elongated in the inner space of the chamber 10 in the vertical direction (z).

Accordingly, a plurality of silicon wafers 110 can be disposed in the inner space of the chamber 10 by being placed in the lying-down position along the horizontal direction (x) while being separated from each other in the vertical direction (z) in the boat 100 elongated in the vertical direction (z).

Up to this point, the first to the third embodiments have been described with an example where the shower nozzle 40 is provided in a round tube shape; however, it is also possible that the shower nozzle 40 is installed at the end portion of the pipe P40 in the shape of a round shower.

Figure 5:
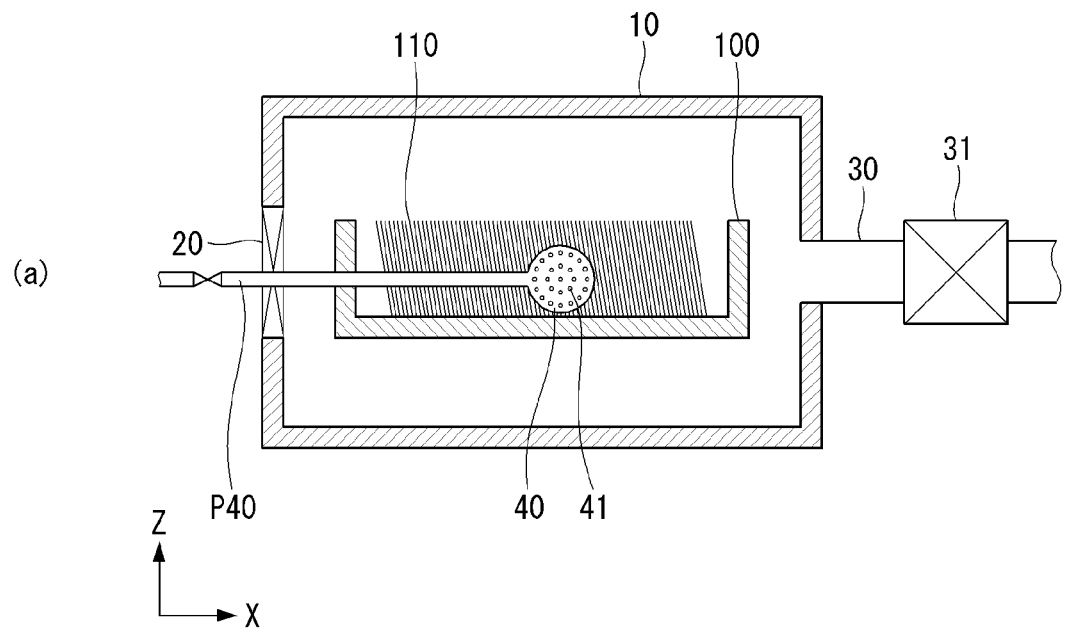
FIGS. 5 and 6 illustrate a fourth embodiment of chemical vapor deposition equipment for solar cells according to the present invention.
Figure 5:
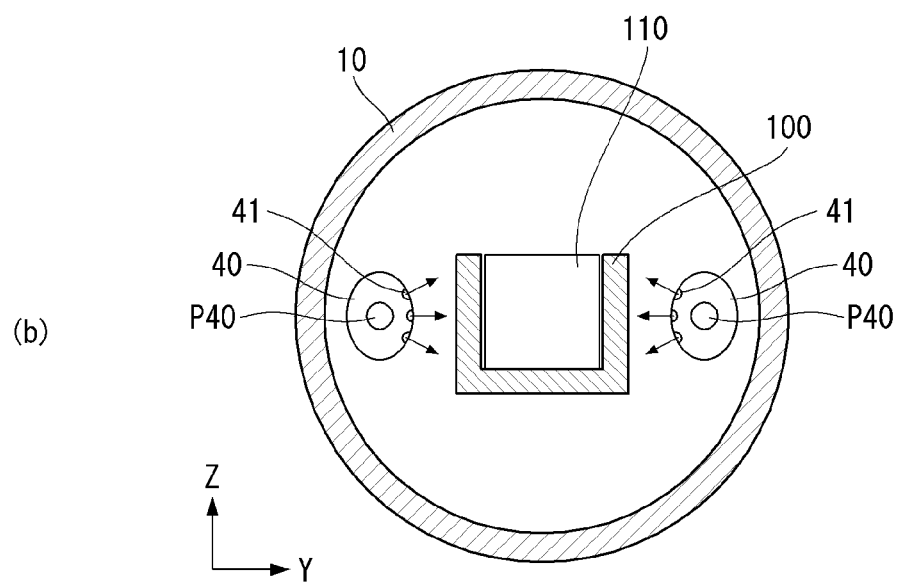
Figure 6:
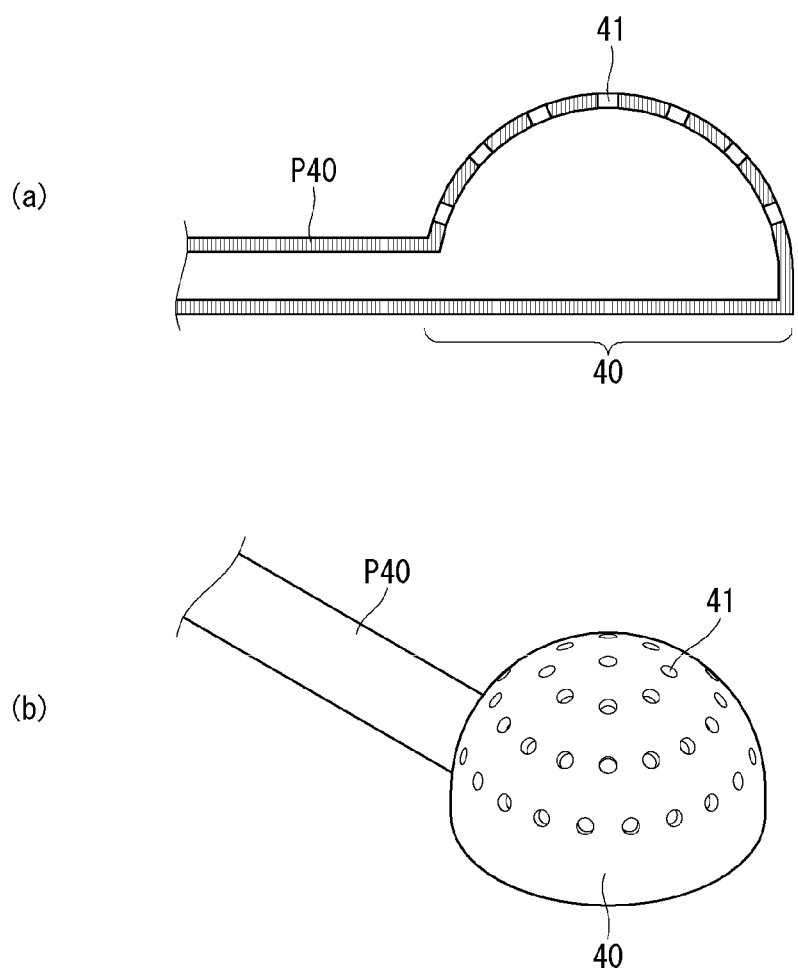

FIGS. 5 and 6 illustrate a fourth embodiment of chemical vapor deposition equipment for solar cells according to the present invention.

(a) of FIG. 5 illustrates a cross-sectional view of chemical vapor deposition equipment for solar cells when it is viewed from the side, and (b) of FIG. 5 illustrates a cross-sectional view of chemical vapor deposition equipment for solar cells when it is viewed from the front.

(a) of FIG. 6 illustrates a cross-sectional view of a shower nozzle 40 according to the fourth embodiment, and (b) of FIG. 6 is a perspective view of the shower nozzle 40 according to the fourth embodiment.

In FIGS. 5 and 6, the remaining structure except for the shower nozzle 40 is the same as illustrated in the first embodiment given above. Therefore, descriptions of the same parts will be omitted, and descriptions will be given only to different parts.

The pipe P40 connected to the shower nozzle 40 can be elongated in the longitudinal direction (x) at about the middle height of the wall body of the chamber. At this time, the pipe P40 can be installed at both sides of the boat 100.

As shown in FIG. 5, the shower nozzle 40 can be connected to the end of the pipe P40 and installed in the shape of a shower.

In other words, as shown in FIG. 6, the shower nozzle 40 according to the fourth embodiment has a cavity the inner space of which is empty, has a round shaped appearance, and has a plurality of holes 41 connected to the cavity on the round shaped surface.

The maximum diameter of the shower nozzle 40 having the cavity structure is larger than that of the pipe P40, and external appearance of the shower nozzle 40 can be in an elliptical or circular shape.

Meanwhile, although the fourth embodiment has been described with an example where the shower nozzle 40 having the cavity structure is provided for each side surface of the boat 100, it is also possible that a plurality of shower nozzles can be provided for each side of the boat 100.

Figure 7:
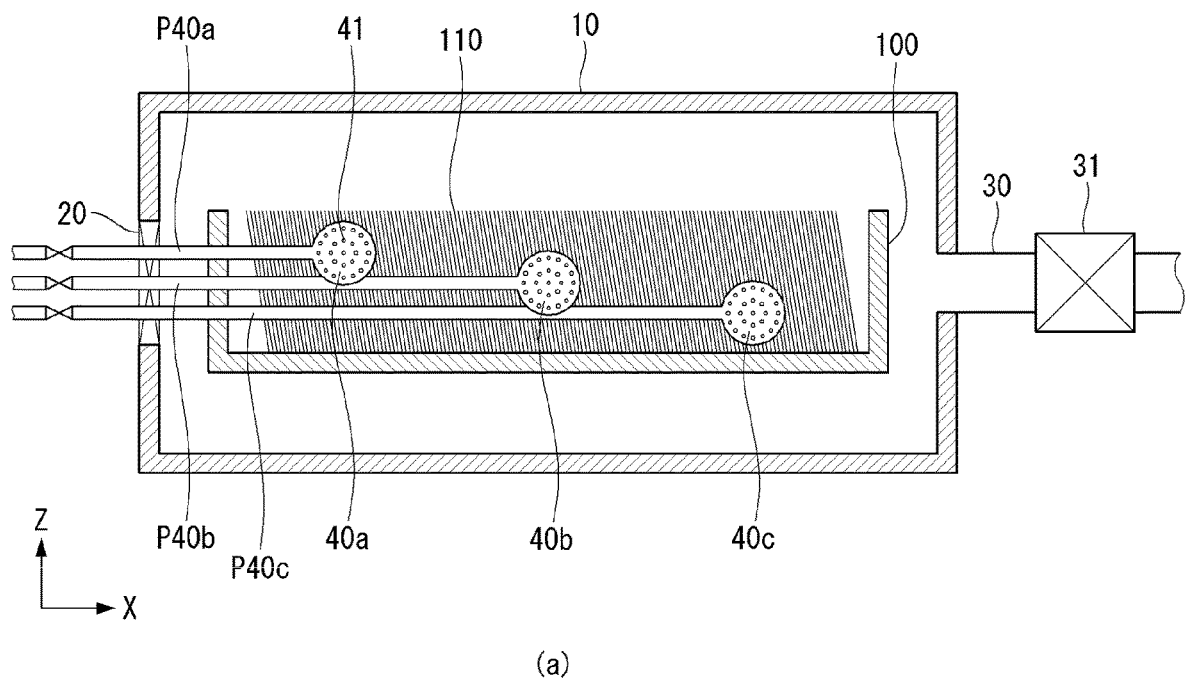
FIG. 7 illustrates a fifth embodiment of chemical vapor deposition equipment for solar cells according to the present invention.
Figure 7:
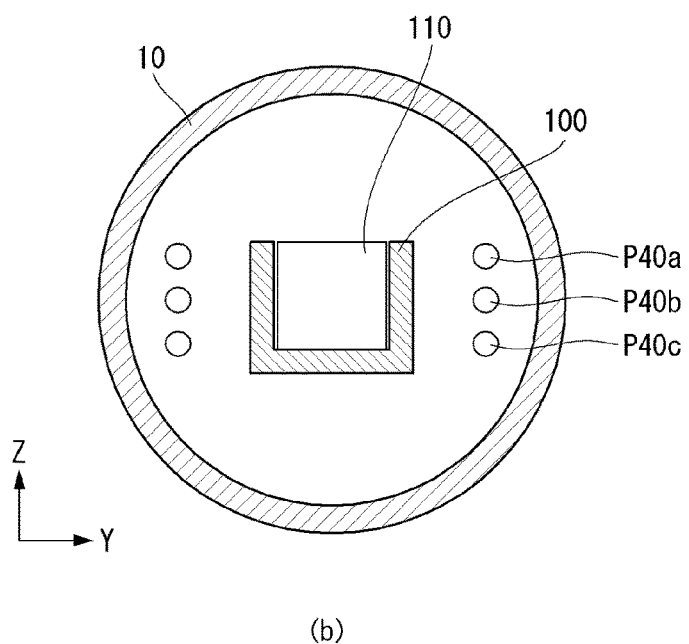

FIG. 7 illustrates a fifth embodiment of chemical vapor deposition equipment for solar cells according to the present invention.

In FIG. 7, descriptions about the same parts given in the fourth embodiment will be omitted, and descriptions will be given only to different parts from the fifth embodiment.

As shown in (a) and (b) of FIG. 7, a plurality of shower nozzles 40a, 40b, 40c having the cavity structure can be provided at each side surface of the boat 100.

In one example, shower nozzles 40a, 40b, 40c can be disposed at the front, center, and rear portion of the boat 100, respectively.

At this time, a plurality of pipes P40a, P40b, P40c can be connected to the plurality of shower nozzles 40a, 40b, 40c installed at both side surfaces of the boat 100. At this time, pipes P40a, P40b, P40c can be disposed at the respective different heights from the bottom surface of the chamber 10.

Figure 8:
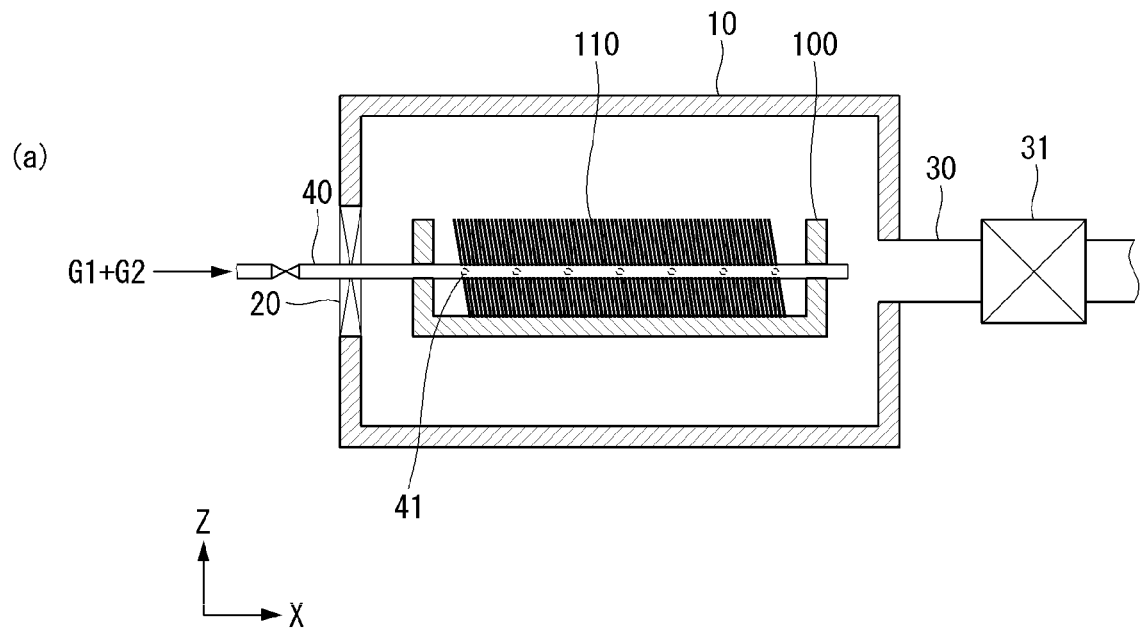
FIGS. 8 to 10 illustrate a sixth embodiment of chemical vapor deposition equipment for solar cells according to the present invention.
Figure 8:
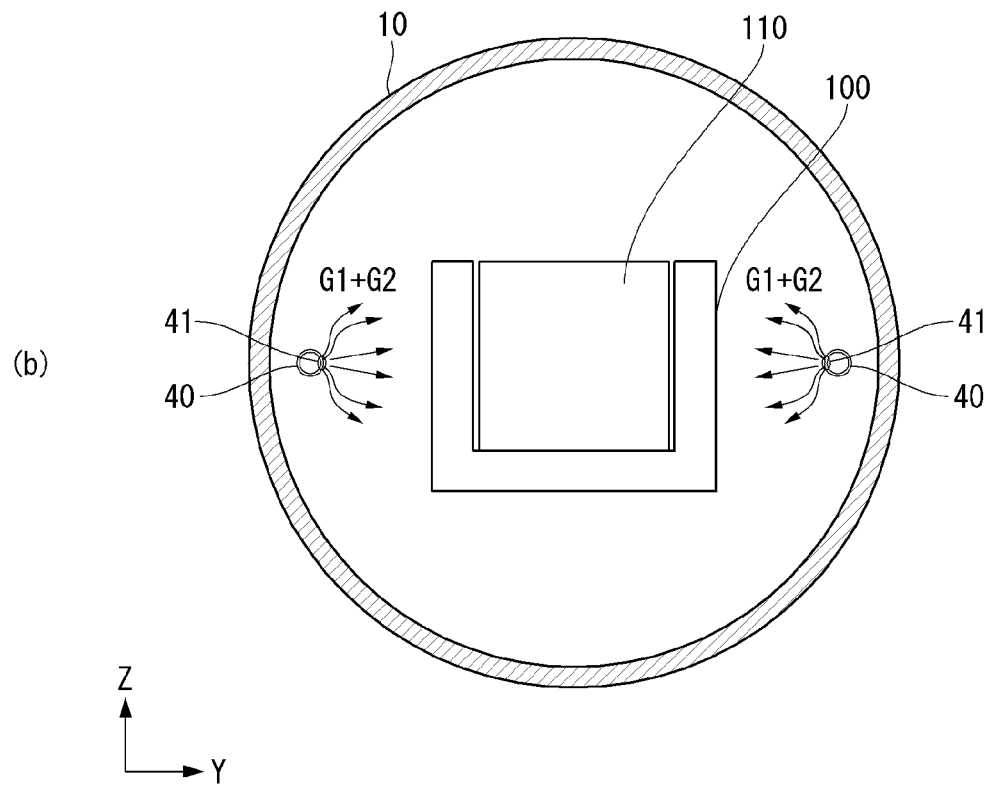
Figure 9:
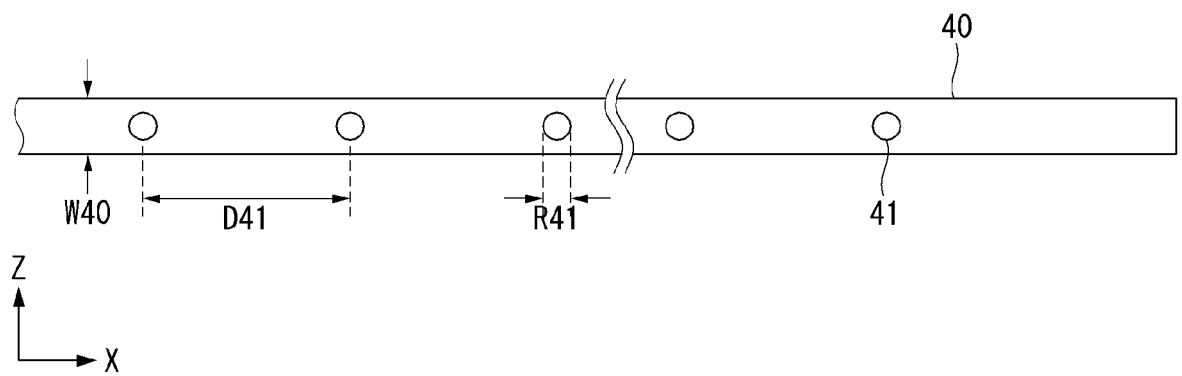
Figure 10:
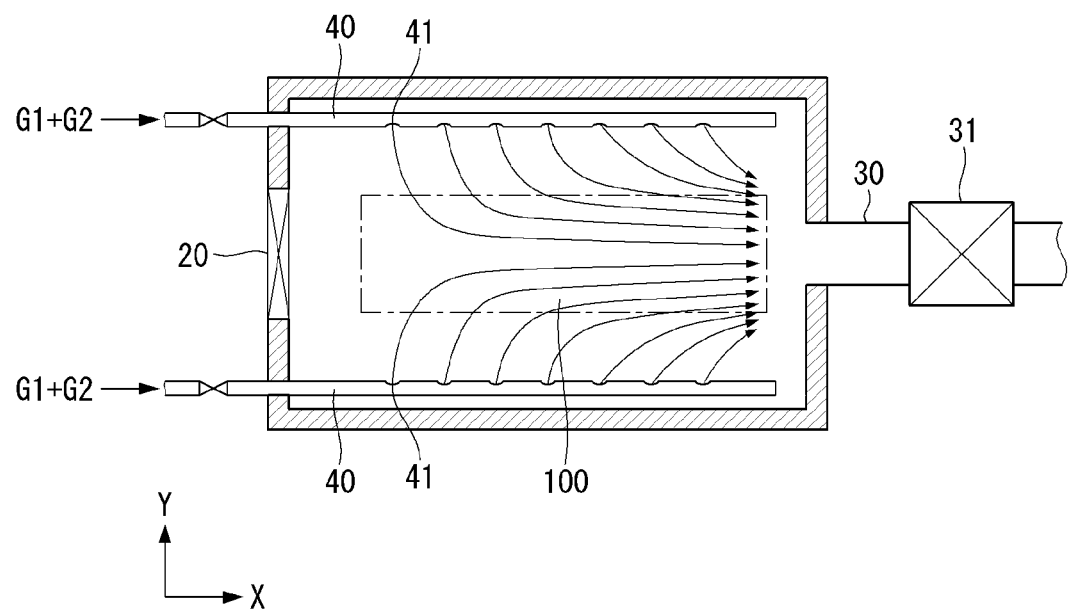

FIGS. 8 to 10 illustrate a sixth embodiment of chemical vapor deposition equipment for solar cells according to the present invention.

(a) of FIG. 8 illustrates a cross-sectional view of chemical vapor deposition equipment for solar cells when it is viewed from the side surface, and (b) of FIG. 8 is a cross-sectional view of the chemical vapor deposition equipment for solar cells when it is viewed from the front surface.

In addition, FIG. 9 illustrates a shower nozzle 40 installed within chemical vapor deposition equipment for solar cells.

Also, FIG. 10 illustrates one example of a convection flow formed as a mixed gas (G1+G2) injected through a shower nozzle 40 moves within the space of the chemical vapor deposition equipment for solar cells shown in FIG. 8; for the convenience of understanding, FIG. 10 omits illustration of the boat 100 and a plurality of silicon wafers 110.

As shown in FIGS. 8 and 9, chemical vapor deposition equipment for solar cells according to the present invention is equipped with a chamber 10 and a shower nozzle 40.

As shown in (a) of FIG. 8, the chamber 10 can comprise inner space which elongates in the horizontal direction (x) and in which a plurality of silicon wafers 110 are disposed and a wall which forms an enclosed space.

More specifically, as shown in (a) of FIG. 8 and (b), the chamber 10 can be elongated in the horizontal direction (x); and can be installed with a door at the front of the chamber 10 in the horizontal direction (x) and with a vent 30 and a vacuum pump 31 at the rear of the chamber 10 in the horizontal direction (x).

A plurality of silicon wafers 110 can be disposed within a boat 100 which extends in the horizontal direction (x) inside the chamber 10.

More specifically, as shown in FIG. 8, a plurality of silicon wafers 110 can be disposed by being separated from the boat 100 horizontally (x) within the boat 100 so that the surfaces of the plurality of silicon wafers 110 face the door 20 or vent 30 in the horizontal direction (x).

The aforementioned structure of disposing a plurality of silicon wafers within the boat 100 can significantly increase the number of silicon wafers 110 on which polycrystalline silicon layers can be deposited in one fell swoop.

As one example, in an ordinary semiconductor manufacturing process other than a semiconductor process for solar cells, the number of wafers 110 on which a certain layer can be deposited at the same time ranges at most from 100 to 200; however, when silicon wafers 110 are disposed in their upright position within the boat 100 as shown in FIG. 8, the number of silicon wafers 110 on which polycrystalline silicon layers can be deposited simultaneously is increased up to 800 to 1000.

Also, although FIG. 8 illustrates a case where only one boat 100 is loaded into the chamber 10, the number of boats 100 can be plural.

Also, although FIG. 8 illustrates a case where a boat 100 is elongated in the horizontal direction (x) inside the chamber 10, it is also possible that the boat 100 is extended in the vertical direction (z) inside the chamber 10 while the boat 100 is put in the upright position.

However, for the sake of convenience, descriptions will be given below with reference to the case illustrated in FIG. 8.

As described above, the silicon wafers for solar cells 110 can be loaded or unloaded to and from the chamber 10 through the door 20 while being disposed within the boat 100.

Here, when a boat 100 which holds a plurality of silicon wafers 110 is loaded and disposed inside the chamber 10, the end portion of the boat 100 in the horizontal direction (x) adjacent to the door 20 inside the chamber 10 can be defined as a front portion of the boat 100, the end portion of the boat 100 adjacent to the vent 30 in the horizontal direction (x) as a rear portion of the boat 100, and the portion of the boat 100 between the front and the rear portion as a central portion.

Also, the vent 30 and the vacuum pump 31 installed in the rear portion of the chamber 10 can discharge the gas injected through the shower nozzle 40 to the outside of the chamber 10.

The shower nozzle 40 can perform the function of injecting a mixed gas (G1+G2) composed of a silicon deposition gas (G1) which deposits a polycrystalline silicon layer on each surface of a plurality of silicon wafers 110 and an impurity gas (G2) doped within the deposited polycrystalline silicon layer.

As shown in FIGS. 8 and 9, the shower nozzle 40 can have a shape of an elongated pipe and be located on the inner side wall of the chamber 10 by being elongated in the horizontal direction (x). On the side surface of the shower nozzle 40, holes 41 which inject a mixed gas (G1+G2) introduced through the shower nozzle 40 from the outside can be installed being separated from each other in the horizontal direction (x).

At this time, in one example, as shown in (a) of FIG. 8 and (b), the opening direction of the holes 41 installed on the side surface of the shower nozzle 40 can be directed to where the boat 100 is located or side surface of the boat 100.

At this time, the diameter W40 of the shower nozzle 40 intersecting the horizontal direction (x) can range from 3 mm to 7 mm.

Also, the spacing D41 between holes 41 installed in the shower nozzle 40 can be formed uniformly within a range of 20 mm to 80 mm by considering the distribution of a mixed gas (G1+G2) or can be formed in an irregular pattern.

FIG. 8 illustrates an example where the horizontal spacing D41 between holes 41 installed in the shower nozzle 40 is kept to be uniform.

Moreover, the diameter R41 of each of the holes 41 installed in the shower nozzle 40 can range from 0.5 mm to 2.5 mm.

Of the mixed gas (G1+G2) introduced to the shower nozzle 40 as described above, the silicon deposition gas (G1) can be injected on the surface of a silicon wafer 110 for solar cells to be deposited as a polycrystalline silicon layer. In one example, the silicon deposition gas (G1) can be Silane (SiH4) gas.

Moreover, of the mixed gas (G1+G2) introduced into the shower nozzle 40, the impurity gas (G2) can be doped within a polycrystalline silicon layer when the polycrystalline silicon layer is deposited on the surface of the silicon wafer 110 for solar cells.

As one example, the impurity gas (G2) can be PH3 gas, but the present invention is not necessarily limited to the specific type of gas, and Boron gas such as BBr3 can also be used.

Therefore, a mixed gas (G1+G2) introduced from the outside to the shower nozzle 40 is injected through the holes 41 of the shower nozzle 40. As shown in FIG. 10, the injected mixed gas (G1+G2) can form a convection flow to be discharged while moving from the front portion adjacent to the door 20 within the space of the deposition equipment to the rear portion of the vent 30.

At this time, part of the mixed gas (G1+G2) can be deposited on the surface of the silicon wafer 110 as a polycrystalline silicon layer doped with impurities, and the remaining part can be sucked by the vacuum pipe 31 and discharged through the vent 30.

As described above, the chemical vapor deposition equipment for solar cells according to one embodiment of the present invention injects the silicon deposition gas (G1) and impurity gas (G2) together through each shower nozzle 40, thereby improving uniformity of thickness of doped polycrystalline silicon layers deposited on the surface of the silicon wafers 110.

Also, chemical vapor deposition equipment for solar cells according to one embodiment of the present invention can deposit doped polycrystalline silicon layers on the surfaces of about 800 to 1000 silicon wafers at the same time, thereby reducing manufacturing time and costs significantly.

The process above will be described in more detail below.

Figure 11:
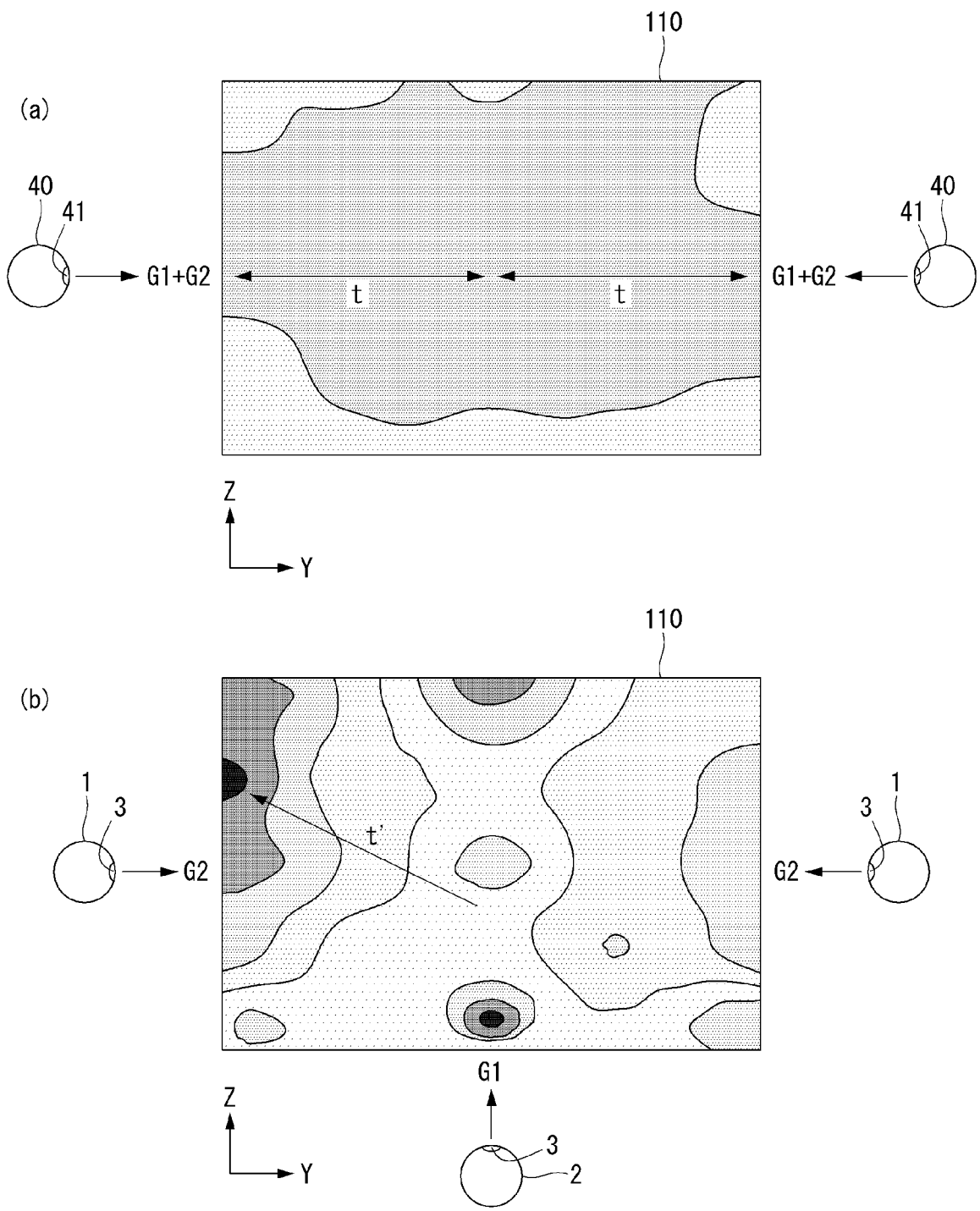
FIG. 11 illustrates an effect of chemical vapor deposition equipment for solar cells according to one example of the present invention.

FIG. 11 illustrates an effect of chemical vapor deposition equipment for solar cells according to one example of the present invention.

(a) of FIG. 11 illustrates thickness uniformity of an doped polycrystalline silicon layer deposited on the surface of a silicon wafer 110 when a mixed gas (G1+G2) composed of a silicon deposition gas (G1) and an impurity gas (G2) is injected through holes 41 of shower nozzles 40 according to the present invention, and (b) of FIG. 11 illustrates a comparative example which shows thickness uniformity of an doped polycrystalline silicon layer deposited on the surface of a silicon wafer 110 when the silicon deposition gas (G1) and the impurity gas (G2) are injected separately through holes 41 of the respective shower nozzles 40 differently from the present invention.

As shown in (a) of FIG. 11, when a mixed gas (G1+G2) composed of the silicon deposition gas (G1) and the impurity gas (G2) is injected through the hole 41 of the shower nozzle 40 according to the present invention, a difference (t) between thickness at the central portion and thickness at the edge portion of the silicon wafer 110 is measured to be less than approximately 4 nm.

However, as shown in the comparative example of (b) of FIG. 11, when the silicon deposition gas (G1) and the impurity gas (G2) are injected separately through holes of the respective shower nozzles differently from the present invention, a difference (t') between thickness at the central portion and thickness at the edge portion is measured to range approximately from 50 to 60 nm.

In particular, in the case of the comparative example, thickness uniformity of an doped polycrystalline silicon layer at the portion of the silicon wafer 110 adjacent to the shower nozzle 2 injecting the silicon deposition gas (G1) and thickness uniformity at the central portion thereof are relatively good; however, it is observed that thickness of an doped polycrystalline silicon layer is excessively thin at the portion of the silicon wafer 110 adjacent to the shower nozzle 1 injecting the impurity gas (G2) and at the edge portion thereof, and thereby thickness uniformity of the doped polycrystalline silicon layer deteriorates relatively.

In other words, as shown in the comparative example, when the silicon deposition gas (G1) and the impurity gas (G2) are injected separately through holes of different shower nozzles 1, 2, the doped polycrystalline silicon layer is deposited relatively thickly at the portion of the silicon wafer 110 adjacent to the shower nozzle 1 injecting the impurity gas (G2) while the doped polycrystalline silicon layer is deposited relatively thinly at the portion of the silicon wafer 110 adjacent to the shower nozzle 1 injecting the impurity gas (G2), from which it can be observed that thickness uniformity of an doped polycrystalline silicon layer deteriorates.

This is so because, although Phosphorus (P) in the impurity gas (G2) acts as an impurity within a polycrystalline silicon layer, a deposition rate of the polycrystalline silicon layer deposited on the surface of the silicon wafer 110 for solar cells can be sped up or slowed down depending on a distribution of the impurity gas (G2).

In other words, it is conjectured that since density of the impurity gas (G2) is relatively high but density of the silicon deposition gas (G1) is relatively low at the portion of the silicon wafer 110 adjacent to the shower nozzle 1 injecting the impurity gas (G2), thickness of a deposited polycrystalline silicon layer is relatively thin. On the other hand, it is conjectured that since density of the silicon deposition gas (G1) is relatively high but density of the impurity gas (G2) is relatively low at the portion of the silicon wafer 110 adjacent to the shower nozzle 2 injecting the silicon deposition gas (G1), thickness of a deposited polycrystalline silicon layer is relatively thick.

In this manner, when the silicon deposition gas (G1) and the impurity gas (G2) are injected separately through holes of the respective shower nozzles 1, 2, distributions of the silicon deposition gas (G1) and the impurity gas (G2) become non-uniform, and thereby thickness of an doped polycrystalline silicon layer deposited on the silicon wafer 110 becomes non-uniform, which can lead to degradation of efficiency of solar cells.

However, according to the present invention, since a mixed gas (G1+G2) composed of the silicon deposition gas (G1) and the impurity gas (G2) is injected through holes 41 of individual shower nozzles 40, distributions of the silicon deposition gas (G1) and the impurity gas (G2) can be made to be more uniform.

Therefore, the present invention can make thickness of an doped polycrystalline silicon layer deposited on a silicon wafer 110 more uniform and thereby can further improve efficiency of solar cells.

Figure 12:
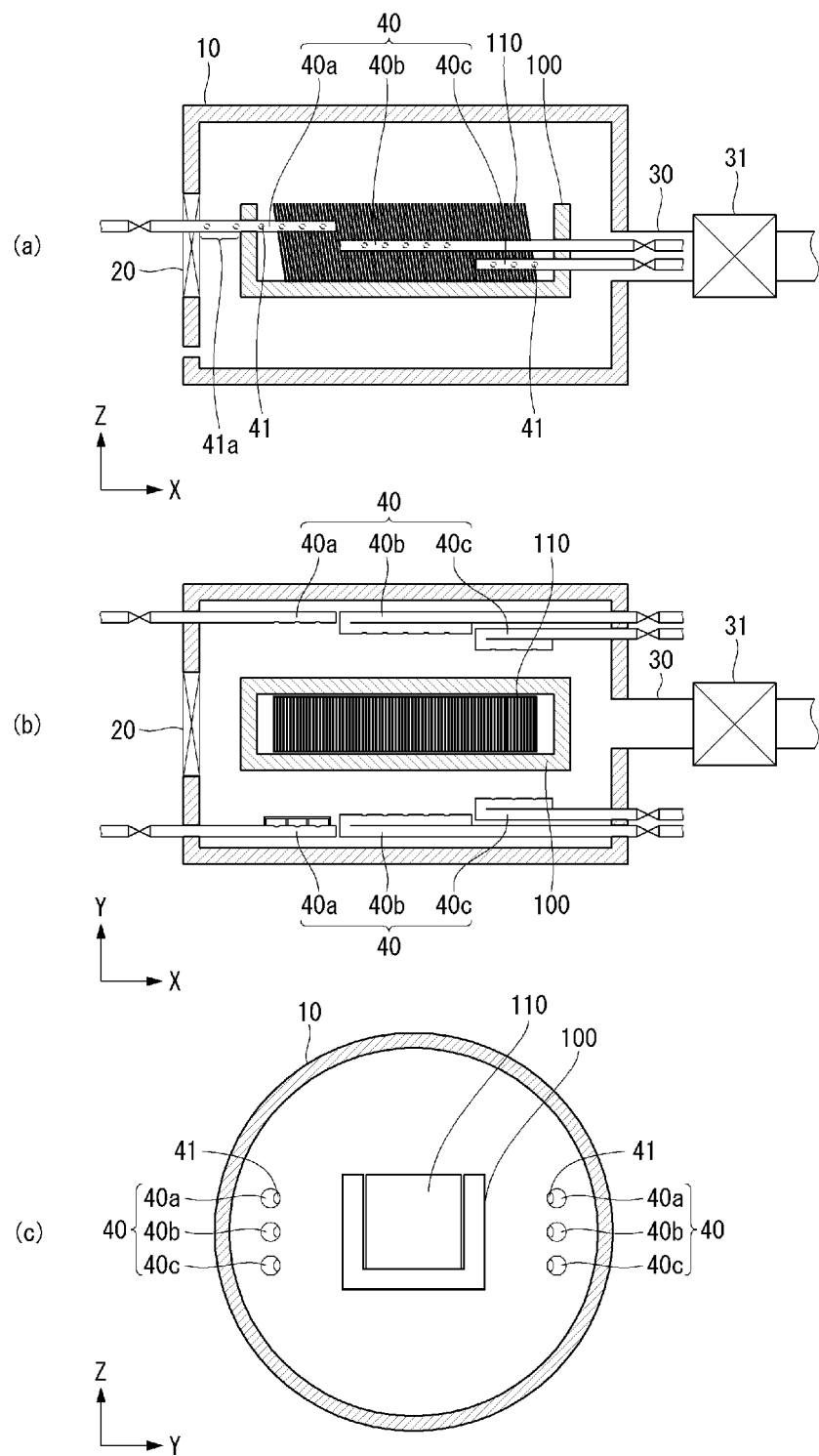
FIG. 12 illustrates a seventh embodiment of chemical vapor deposition equipment for solar cells according to the present invention.

Up to this point, the present invention has been described on an assumption that only one shower nozzle 40 is disposed on each side wall inside the chamber 10; however, to further improve the distribution of a mixed gas (G1+G2), it is also possible to dispose a plurality of shower nozzles 40 on each side wall inside the chamber 10. FIG. 12 will describe the latter case below.

It should be noted that FIG. 12 and subsequent figures omit the content described previously for the convenience of descriptions.

FIG. 12 illustrates a seventh embodiment of chemical vapor deposition equipment for solar cells according to the present invention.

(a) of FIG. 12 illustrates a cross-sectional view of chemical vapor deposition equipment for solar cells when viewed from the side, (b) of FIG. 12 illustrates a cross-sectional view of chemical vapor deposition equipment for solar cells when viewed from the top to the bottom, and (c) of FIG. 12 illustrates a cross-sectional view of chemical vapor deposition equipment for solar cells when viewed from the front.

As shown in (a) to (c) of FIG. 12, each shower nozzle 40 disposed on each inner wall surface of the chamber 10 can be installed with a first sub-shower nozzle 40a, second sub-shower nozzle 40b, and third sub-shower nozzle 40c.

The first sub-shower nozzle 40a injects a mixed gas (G1+G2) to a portion of the boat 100 adjacent to the door 20, the second sub-shower nozzle 40b injects the mixed gas (G1+G2) to the central portion of the boat 100, and the third sub-shower nozzle 40c injects the mixed gas (G1+G2) to a portion of the boat 100 adjacent to the vent 30.

Meanwhile, a plurality of holes 41 injecting the mixed gas (G1+G2) can be installed on the side surface of each of the first, second, and third sub-shower nozzle 40a, 40b, 40c by being separated from each other in the horizontal direction (x).

At this time, the opening direction of a plurality of holes 41 installed on each of the first, second, and third sub-shower nozzle 40a, 40b, 40c can intersect the horizontal direction (x).

Here, the first sub-shower nozzle 40a can be equipped with a plurality of holes 41, while being extended from the door 20 side to the front and central portion of the boat 100.

While being extended from the vent 30 side toward the door 20, the second sub-shower nozzle 40b can be bent at a portion adjacent to the end portion of the first sub-shower nozzle 40a and extended again toward the vent 30, where a plurality of holes 41 can be formed in an area spanning from the portion where the second sub-shower nozzle 40b is bent to the end portion of the second sub-shower nozzle 40b.

Also, while being extended from the vent 30 side toward the door 20, the third sub-shower nozzle 40c can be bent at a portion adjacent to the end portion of the second sub-shower nozzle 40b and extended again toward the vent 30, where a plurality of holes 41 can be formed in an area spanning from the portion where the third sub-shower nozzle 40c is bent to the end portion of the third sub-shower nozzle 40c.

However, the present invention is not limited to the specific example; it is also possible that instead of being bent, the second and third sub-shower nozzle 40 can be elongated in one direction like the first sub-shower nozzle 40a.

Similarly, different from FIG. 12, all of the first, second, and third sub-shower nozzle 40 can be extended from the door 20 side toward the vent 30; on the contrary to the example, all of the first, second, and third sub-shower nozzle 40 can be extended from the vent 30 side toward the door 20.

Similarly, different from FIG. 12, any one of the first, second, and third sub-shower nozzle 40 or a plurality of sub-shower nozzles can all be extended from the door 20 side toward the vent 30 while the remaining sub-shower nozzles are extended in the opposite direction from the vent 30 side toward the door 20.

Also, as shown in (c) of FIG. 12, the first, second, and third sub-shower nozzle 40a, 40b, 40c can be arranged in a line by being separated from each other in the vertical direction (z) on the inner wall surface of the chamber 10.

As described above, the present invention distinguishes shower nozzles installed on each of the inner side wall of the chamber 10 by the first sub-shower nozzle 40a, second sub-shower nozzle 40b, and third sub-shower nozzle 40c, thereby making a mixed gas (G1+G2) injected with a uniform pressure over the front, central, and rear portion of the boat 100 disposed inside the chamber 10.

Accordingly, deviation of thicknesses of doped polycrystalline silicon layers deposited on the respective surfaces of the silicon wafers 110 can be prevented from being increased according to the positions of the plurality of silicon wafers 110 disposed within the boat 100.

Therefore, thickness deviation among polycrystalline silicon layers deposited on the respective silicon wafers disposed separately at the front, central, and rear portion of the boat 100 can be further reduced.

Also, in one example, as shown in (a) and (b) of FIG. 12, part 41a of a plurality of holes 41 formed on the first sub-shower nozzle 40a can be located in the space formed between the door 20 and the end portion of the boat 100 adjacent to the door 20 side in the horizontal direction (x) and the door (2).

The structure above has been introduced to take into account a convention flow pattern according to which the mixed gas (G1+G2) moves inside the inner space of deposition equipment.

More specifically, similarly to the illustration of FIG. 10, after being injected from each sub-shower nozzle 40, the convection flow of a mixed gas (G1+G2) which moves in the inner space of deposition equipment can be directed largely to the vent 30 of the deposition equipment.

Accordingly, the amount of a mixed gas (G1+G2) injected into the space between the boat 100 and the door 20 can become relatively small.

Accordingly, the polycrystalline silicon layer deposited on the silicon wafer 110 disposed in the vicinity of the end portion of the boat 100 adjacent to the door 20 side can be so deposited that thickness of the polycrystalline silicon layer is relatively thinner than the thicknesses of polycrystalline silicon layers deposited on the silicon wafers 110 disposed in the central and rear portion of the boat 100.

However, if part 40a of a plurality of holes 41 formed on the first shower nozzle 40 are located in the space between the door 20 side and the end portion of the boat 100 adjacent to the door 20 side in the horizontal direction (x), the amount of the mixed gas (G1+G2) injected into the space between the boat 100 and the door 20 becomes relatively large, and thereby polycrystalline silicon layers can be deposited more uniformly even on the silicon wafer 110 disposed in the vicinity of the front portion of the boat 100 adjacent to the door 20 side.

Up to this point, the present invention has been described with respect to an example where spacing between holes 41 installed on each sub-shower nozzle 40 is uniform, the spacing between holes 41 need not be uniform. Descriptions of the non-uniform case will be given with reference to FIG. 13.

Figure 13:
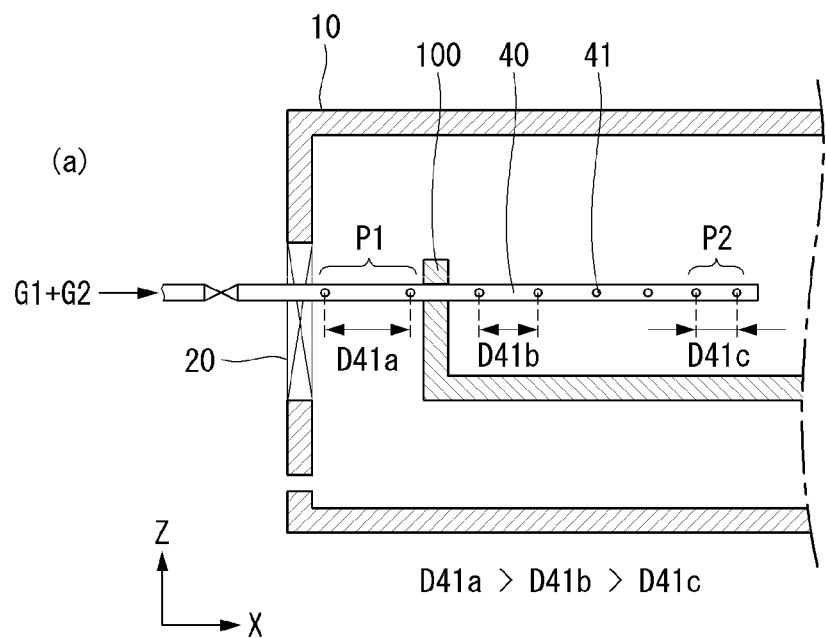
FIG. 13 illustrates an eighth embodiment of chemical vapor deposition equipment for solar cells according to the present invention.
Figure 13:
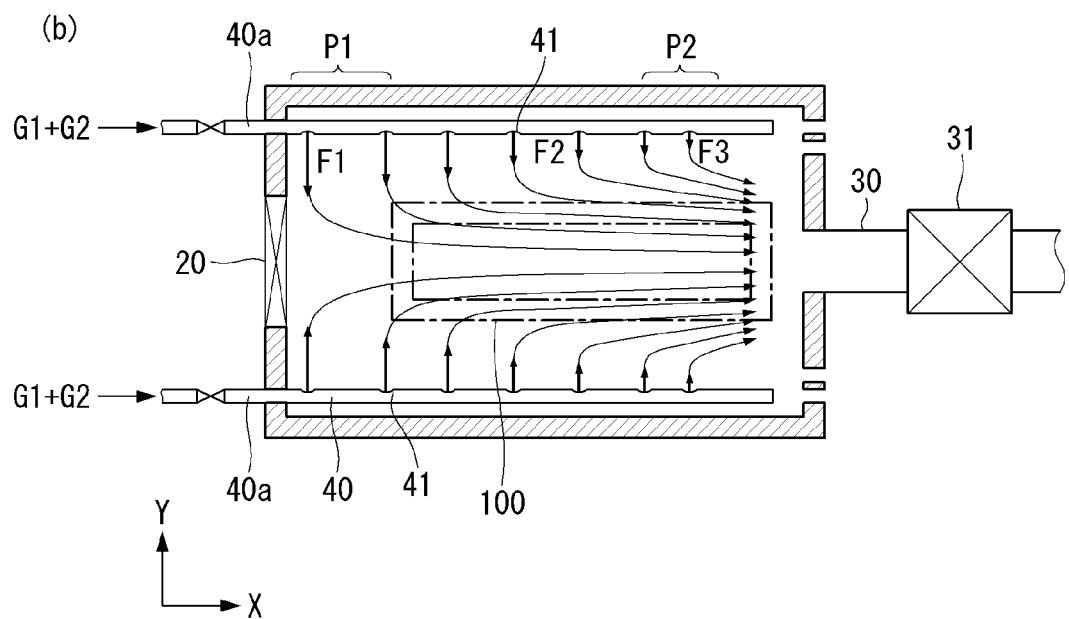

FIG. 13 illustrates an eighth embodiment of chemical vapor deposition equipment for solar cells according to the present invention.

(a) of FIG. 13 illustrates a cross-sectional view of the front portion of chemical vapor deposition equipment for solar cells at the door 20 side when viewed from the side, and (b) of FIG. 13 illustrates a cross-sectional view of the front portion of chemical vapor deposition equipment for solar cells at the door 20 side when viewed from the top to the bottom.

According to the present invention, at least one sub-shower nozzle among the first, second, and third sub-shower nozzle 40a, 40b, 40c can have holes 41 located at irregular intervals.

More specifically, by considering the fact that when a mixed gas (G1+G2) introduced to the shower nozzle 40 is injected through each hole 41, injecting pressure of the mixed gas (G1+G2) is diminished as it goes to the end portion of the shower nozzle 40 and a convection flow pattern of the mixed gas (G1+G2) within the deposition equipment, the space between holes 41 located in a first portion close to the entrance through which the mixed gas (G1+G2) flows into at least one sub-shower nozzle can be formed to be larger than the space between holes 41 located in a second portion closer to the end portion of at least one sub-shower nozzle.

Also, the spacing between holes 41 in at least one sub-shower nozzle can be decreased gradually as it moves from the first portion to the second portion.

Accordingly, by increasing spacing between holes 41 for a space in the sub-shower nozzle 40 where injecting pressure of the mixed gas (G1+G2) is large and reducing spacing between holes 41 for a space in the sub-shower nozzle 40 where injecting pressure of the mixed gas (G1+G2) is small, the overall density of the mixed gas (G1+G2) can be made to be more uniform in the inner space of deposition equipment.

In one example, as shown in (a) of FIG. 13, the spacing D41a between holes 41 located in the first portion P1 adjacent to the entrance through which the mixed gas (G1+G2) is introduced to the first sub-shower nozzle 40a can be made to be larger than the spacing D41c between holes 41 located in the second portion P2 adjacent to the end portion of the first sub-shower nozzle 40a.

Also, as shown in (a) of FIG. 13, as it moves from the first portion P1 to the second portion P2, the spacing between holes 41 in the first sub-shower nozzle 40 can be decreased gradually in the order of D41a, D41b, and D41c.

Therefore, in the case of the first sub-shower nozzle 40a, the spacing D41a between holes 41 located in the space between the door 20 and the front portion of the boat 100 adjacent to the door 20 side can be larger than the spacing D41b between holes 41 close to the side surface of the boat 100, and the spacing between holes 41 can be decreased gradually as it moves to the end portion of the first sub-shower nozzle 40a.

Accordingly, as shown in (b) of FIG. 13, by taking into account the pattern of a convention flow of the mixed gas (G1+G2) which moves from the door 20 side toward the vent 30 as a whole, the mixed gas (G1+G2) can be made to be injected at a higher pressure into the space between the front portion of the boat 100 and the door 20, and density of the mixed gas (G1+G2) can be made to be more uniform across the whole inner space of the chamber 10.

Up to this point, descriptions have been given on an assumption that opening direction of the holes 41 provided on the side surface of the shower nozzle 40 is directed toward the position at which the boat 100 is located or toward the side surface of the boat 100.

However, as congestion of a convection flow pattern of a mixed gas (G1+G2) formed in the inner space of the chamber 10 is improved, density of the mixed gas (G1+G2) can become more uniform across the whole inner space of the chamber 10.

In what follows, described will be an example of a structure in which congestion of a convection flow pattern of a mixed gas (G1+G2) formed in the inner space of the chamber 10 of deposition equipment according to the present invention is improved furthermore.

Figure 14:
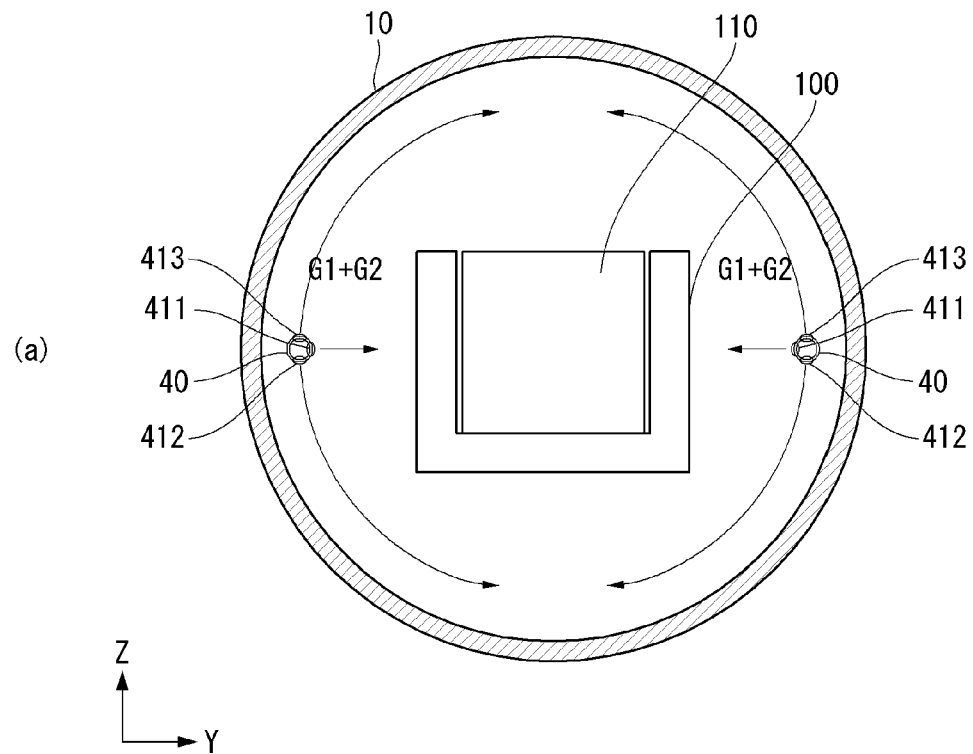
FIG. 14 illustrates a ninth embodiment of chemical vapor deposition equipment for solar cells according to the present invention.
Figure 14:
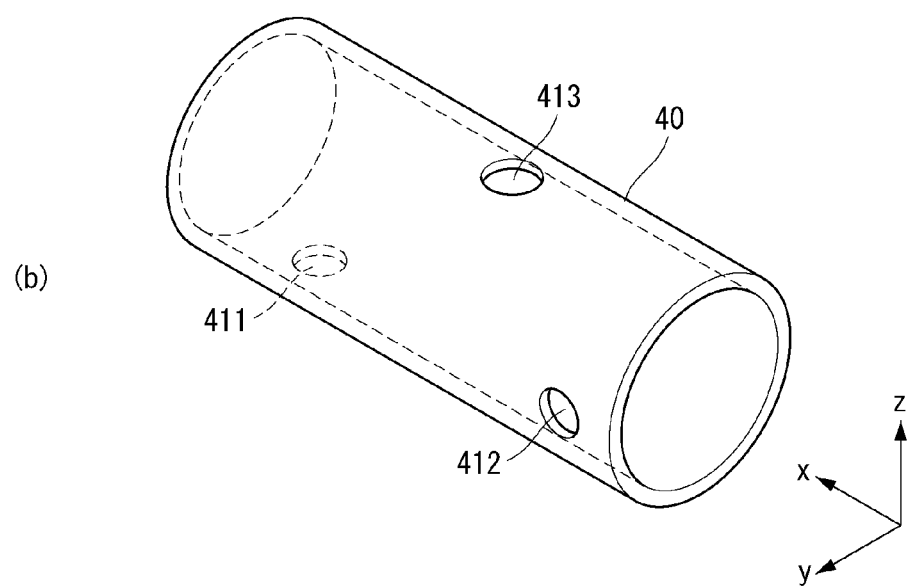

FIG. 14 below illustrates one example where opening direction of holes 41 provided on the side surface of the shower nozzle 40 is directed toward the position at which the boat 100 is located or toward the side surface of the boat 100 in order to further improve congestion of a convection flow pattern of a mixed gas (G1+G2) formed in the inner space of the chamber 10. Flow patterns F1, F2 and F3 are shown from holes 41 toward the vent 30, for example.

FIG. 14 shows a cross-sectional view of chemical vapor deposition equipment for solar cells when viewed from the front to illustrate a ninth embodiment of chemical vapor deposition equipment for solar cells according to the present invention.

As shown in (a) and (b) of FIG. 14, holes 41 provided in a shower nozzle 40 of chemical vapor deposition equipment for solar cells according to the ninth embodiment of the present invention can comprise a first hole 411 of which the opening is directed toward a side surface of a boat 100 and a second hole 412, 413 of which the opening is directed toward the bottom and/or the top of a chamber 10.

Accordingly, as shown in (a) and (b) of FIG. 14, when the chemical vapor deposition equipment for solar cells is viewed from the front, a convection flow pattern of a mixed gas (G1+G2) can be formed not only in a direction toward the side surface of the boat 100 but also in a direction toward the bottom of the chamber 10 and/or toward the top of the chamber 10.

Therefore, congestion of a convection flow pattern of the mixed gas (G1+G2) formed in the inner space of the chamber 10 can be further improved.

The first hole 411 and the second hole 412, 413 can be applied to at least one of the first, second, and third shower nozzle 40a, 40b, 40c.

Therefore, at least one sub-shower nozzle among the first, second, and third sub-shower nozzle 40a, 40b, 40c can have a first hole 412 of which the opening is directed to the side surface of the boat 100 and a second hole 411, 413 of which the opening is directed to the bottom of the chamber 10 and/or to the top of the chamber 10.

Up to this point, descriptions have been given to the case where holes 41 are provided on the side surface in the longitudinal direction of the shower nozzle 40; in order to further improve congestion of a convection flow pattern of the mixed gas (G1+G2), however, it is also possible to have the holes 41 formed at the end portion of the shower nozzle 40. In what follows, the latter case will be described in more detail.

Figure 15:
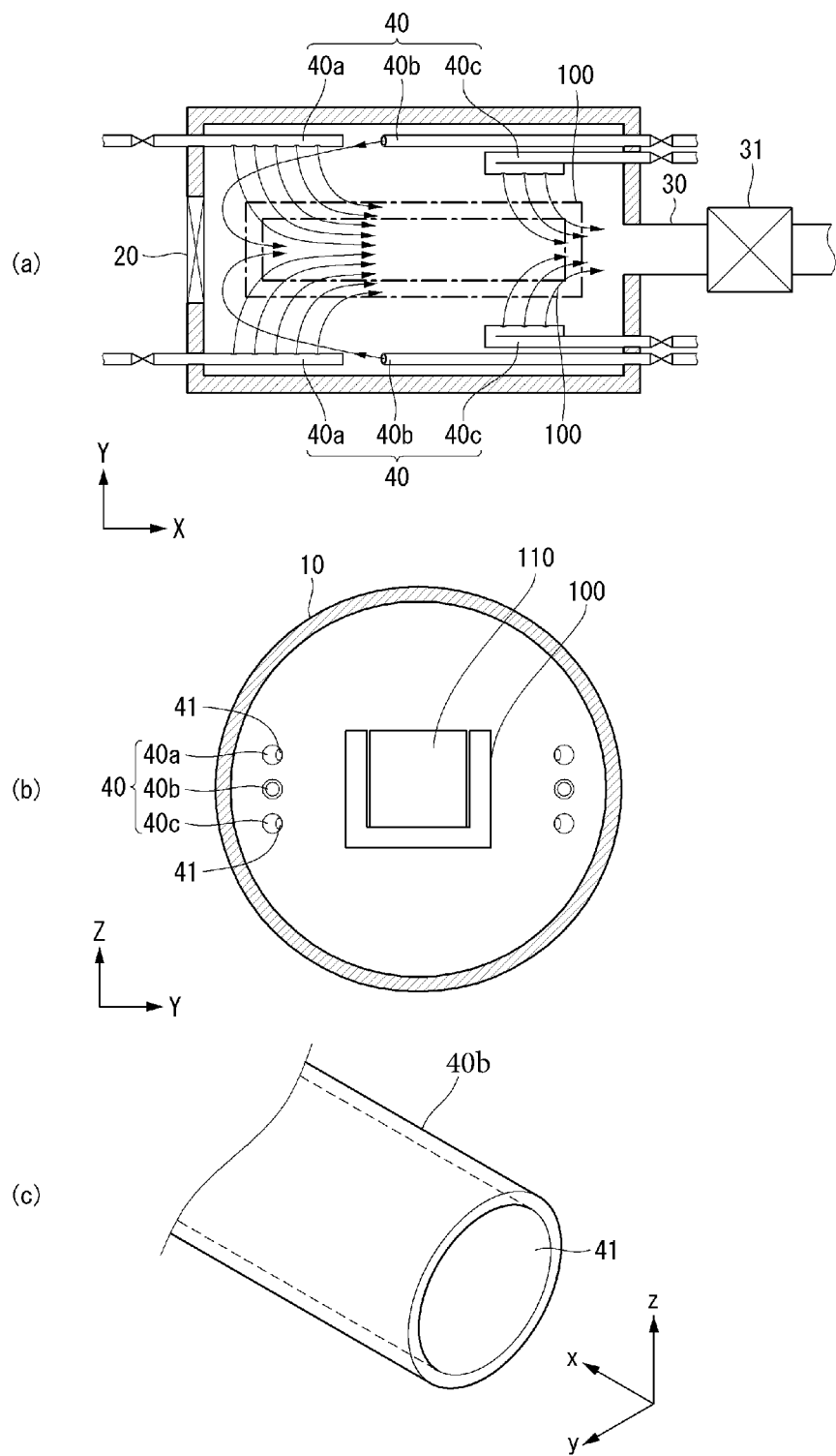
FIG. 15 illustrates a tenth embodiment of chemical vapor deposition equipment for solar cells according to the present invention.

FIG. 15 illustrates a tenth embodiment of chemical vapor deposition equipment for solar cells according to the present invention.

(a) of FIG. 15 shows a cross-sectional view of chemical vapor deposition equipment for solar cells when viewed from the top to the bottom, (b) of FIG. 15 shows a cross-sectional view of chemical vapor deposition equipment for solar cells when viewed from the front, and (c) of FIG. 15 shows a magnified view of an end portion of a second sub-shower nozzle 40b.

In the chemical vapor deposition equipment for solar cells according to the tenth embodiment of the present invention, at least one sub-shower nozzle 40 among the first, second, and third sub-shower nozzle 40a, 40b, 40c can have holes 41 at the end portion of the at least one sub-shower nozzle 40, where opening of the holes 41 is in the horizontal direction (x).

As one example, as shown in (b) and (c) of FIG. 15, a second sub-shower nozzle 40b among the first, second, and third sub-shower nozzle 40a, 40b, 40c can have holes 41 at the end portion of the second sub-shower nozzle 40b, where opening of the holes 41 is in the horizontal direction (x) which is the longitudinal direction of the second sub-shower nozzle 40b.

At this time, the second sub-shower nozzle 40b need not have holes the opening direction (z, y) of which intersects the horizontal direction (x).

Also, at this time, the first and third sub-shower nozzle 40a, 40c can have holes 41 the opening direction (z, y) of which intersects the horizontal direction (x).

Here, the diameters of holes 41 formed at the end portion of the second sub-shower nozzle 40b can be larger than the diameters of the holes 41 formed on the side surface in the longitudinal direction of the first and third sub-shower nozzle 40a, 40c.

As one example, the diameters of holes 41 formed at the end portion of the second sub-shower nozzle 40b can be the same as the diameter of the second sub-shower nozzle 40b.

In the case chemical vapor deposition equipment for solar cells according to the tenth embodiment, at least one sub-shower nozzle 40b can have holes 41 at the end portion thereof, the opening of which is in the horizontal direction (x), and thereby, as shown in (a) of FIG. 15, congestion of a convection flow pattern of a mixed gas (G1+G2) in the inner space of deposition equipment can be furthermore improved.

Accordingly, doped polycrystalline silicon layers can be deposited on each surface of a plurality of silicon wafers 110 more uniformly.

Up to this point, the embodiments of the present invention have been described separately, but each individual embodiment can be combined with each other as long as they are compatible with each other.

Also, up to this point, the embodiments have been described with respect to the case where at least one shower nozzle among a plurality of shower nozzles elongated in the horizontal direction has holes which inject a mixed gas on the side surface of the shower nozzle.

However, differently from the descriptions above, it is also possible that all of the shower nozzles have holes which inject a mixed gas on the side surface of the shower nozzle at the end portion of each shower nozzle.

In what follows, the structure above will be described in more detail.

Figure 16:
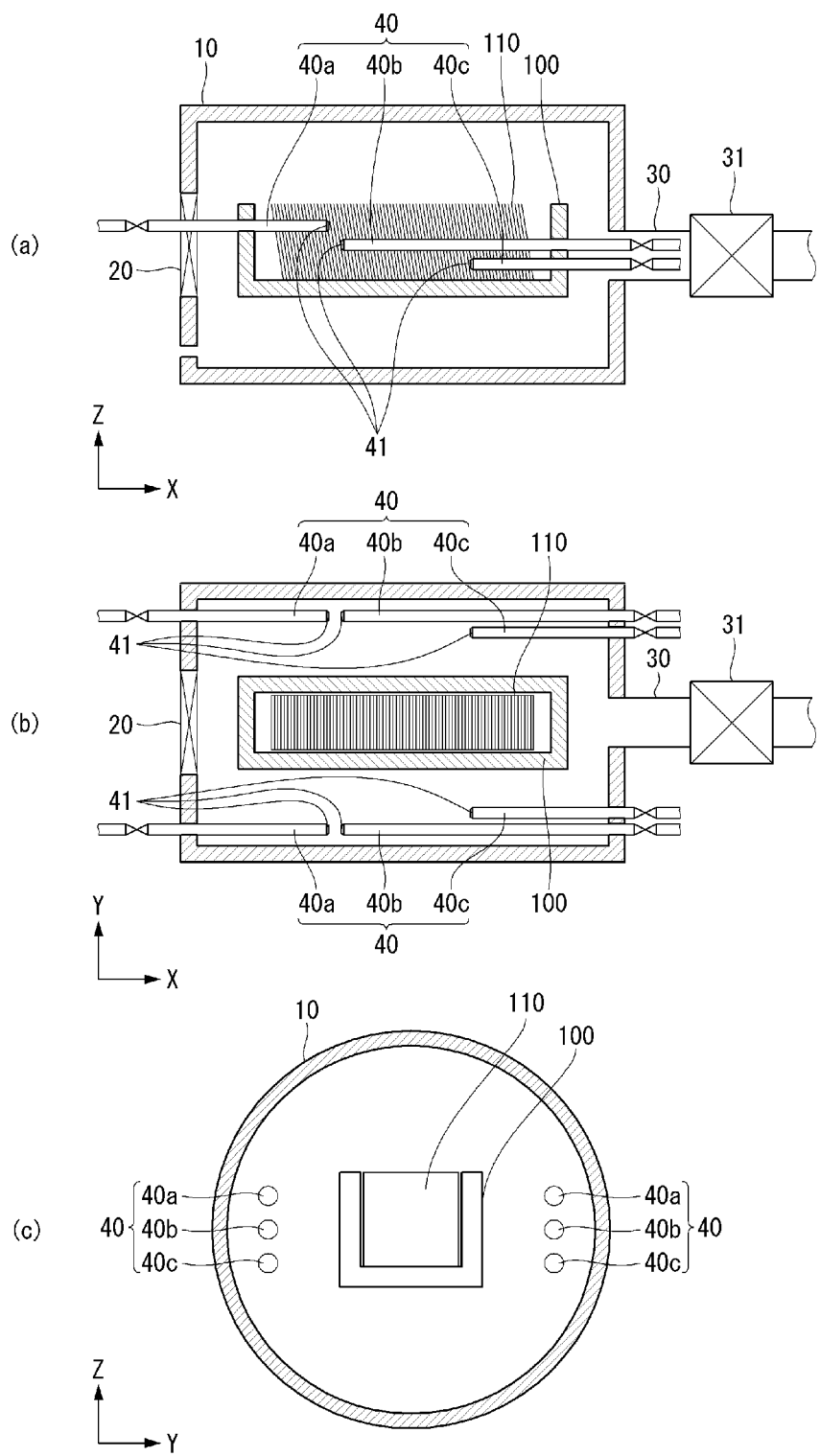
FIGS. 16 to 17 illustrate an eleventh embodiment of chemical vapor deposition equipment for solar cells according to the present invention.
Figure 17:
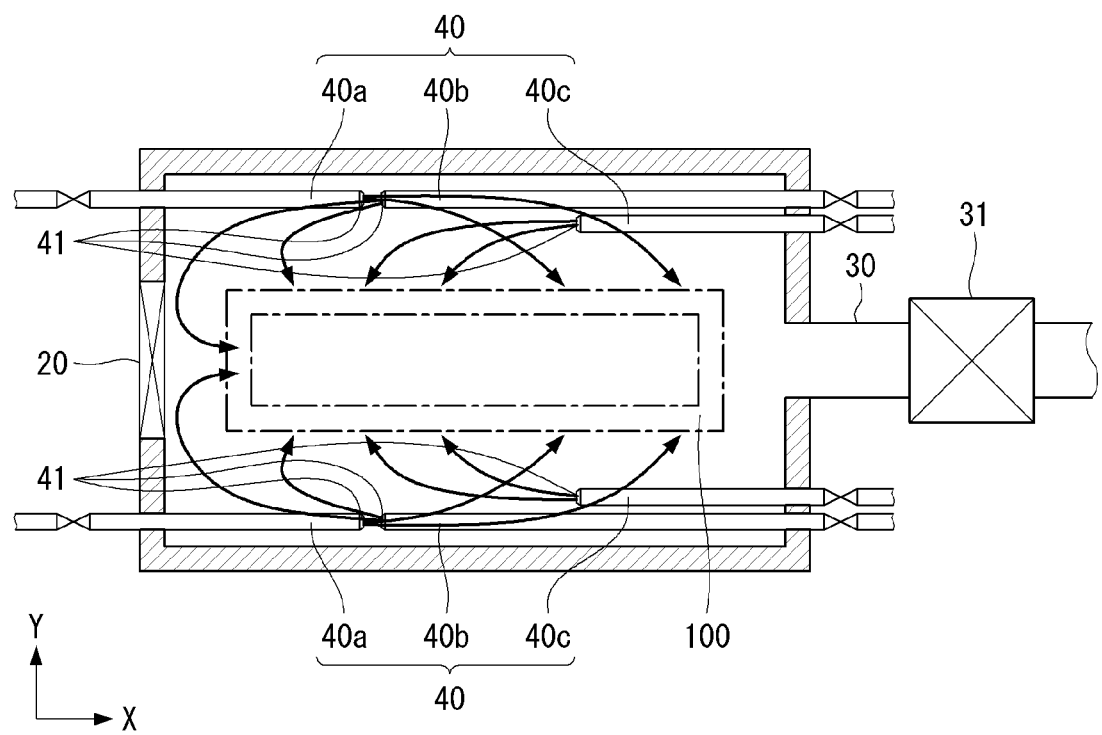

FIGS. 16 and 17 illustrate a eleventh embodiment of chemical vapor deposition equipment for solar cells according to the present invention.

In describing FIGS. 16 and 17, descriptions of the same parts given previously in FIGS. 8 to 15 will be omitted, and descriptions will be given mainly to different parts.

(a) of FIG. 16 illustrates a cross-sectional view of chemical vapor deposition equipment for solar cells when viewed from the side, (b) of FIG. 16 illustrates a cross-sectional view of chemical vapor deposition equipment for solar cells when viewed from the top to the bottom, and (c) of FIG. 16 illustrates a cross-sectional view of chemical vapor deposition equipment for solar cells when viewed from the front.

It should be noted that for the convenience of understanding, (b) of FIG. 16 shows a first, second, and third shower nozzle 40 (40a, 40b, 40c) when viewed from the top, and the second and third shower nozzle 40 (40b, 40c) are installed as if they are shifted away from each other. However, as shown in (c) of FIG. 16, the second and third shower nozzle 40 (40b, 40c) can actually be arranged in a line by being separated from each other in the vertical direction (z).

FIG. 17 illustrates how a mixed gas (G1+G2) is injected when chemical vapor deposition equipment for solar cells of FIG. 16 is operated.

As shown in FIG. 16, chemical vapor deposition equipment for solar cells according to the eleventh embodiment of the present invention can have a plurality of shower nozzles 40 through which a mixed gas (G1+G2) is introduced, and holes 41 through which the mixed gas (G1+G2) is injected can be located at the respective end portions of the plurality of shower nozzles 40.

At this time, individual holes 41 installed in the plurality of shower nozzles 40 can be open in different directions toward the door 20 side or toward the vent 30 side.

In one example, the shape of each hole 41 installed in the plurality of shower nozzles 40 can be the same as shown in (c) of FIG. 15.

More specifically, as shown in (a) to (c) of FIG. 16, the shower nozzle 40 can include a first, second, and third sub-shower nozzle 40a, 40b, 40c.

The first, second, and third sub-shower nozzle 40a, 40b, 40c can be installed on each side wall around a boat disposed inside the chamber, where the first, second, and third sub-shower nozzle 40a, 40b, 40c can be disposed being arranged in a line while being separated from each other in the vertical direction (z).

The first sub-shower nozzle 40a is extended up to the front portion of the boat from the door 20 side, and the end portion of the first sub-shower nozzle 40a is located adjacent to the door 20 side, having holes 41 injecting a mixed gas (G1+G2) at the end portion of the first sub-shower nozzle 40a.

The holes 41 installed at the end portion of the first shower nozzle 40a can be opened toward the vent 30.

The second sub-shower nozzle 40b is extended up to the central portion of the boat from the vent 30 side, and the end portion of the second sub-shower nozzle 40b is located in the central portion of the boat, having holes 41 injecting a mixed gas (G1+G2) at the end portion of the second sub-shower nozzle 40b.

The holes 41 installed at the end portion of the second shower nozzle 40b can be opened toward the door 20.

The third sub-shower nozzle 40c is extended up to the rear portion of the boat from the vent 30 side, and the end portion of the third sub-shower nozzle 40c is located adjacent to the vent 30 side, having holes 41 injecting a mixed gas (G1+G2) at the end portion of the third sub-shower nozzle 40c.

The holes 41 installed at the end portion of the third shower nozzle 40c can be opened toward the door 20.

The holes 41 installed at the respective end portions of the first, second, and third sub-shower nozzle 40a, 40b, 40c can be opened toward the vent 30 or toward the door 20, thereby further improving congestion of the mixed gas (G1+G2) injected into the inner space of the chamber, and the improved congestion can further increase uniformity of polycrystalline silicon layers deposited on a plurality of silicon wafer surfaces disposed in the boat.

More specifically, as shown in the eleventh embodiment of FIG. 16, suppose the holes 41 installed at the respective end portions of the first, second, and third shower nozzle 40 are opened toward the door 20 or toward the vent 30. As shown in FIG. 17, when chemical vapor deposition equipment for solar cells are operated, the pattern by which the mixed gas (G1+G2) is injected becomes more complicated, and therefore, deposition uniformity of doped polycrystalline silicon layers on the surface of silicon wafer 110 can be further improved.

More specifically, the mixed gas (G1+G2) injected from the first sub-shower nozzle 40a can be injected toward the vent 30 at the front portion of the boat and can be deposited on the surface of a silicon wafer disposed at the central and rear portion of the boat.

The mixed gas (G1+G2) injected from the second sub-shower nozzle 40b can be injected toward the door 20 at the central portion of the boat and can be deposited on the surface of a silicon wafer disposed at the front portion of the boat.

The mixed gas (G1+G2) injected from the third sub-shower nozzle 40c can be injected toward the vent 30 at the rear portion of the boat and can be deposited on the surface of a silicon wafer disposed at the front portion of the boat.

At this time, since the first, second, and third sub-shower nozzle 40a, 40b, 40c inject the mixed gas (G1+G2) in different and opposite injecting directions, the mixed gas (G1+G2) injected from the first, second, and third sub-shower nozzle 40a, 40b, 40c exerts an influence to each other; congestion of the injected mixed gas (G1+G2) is further increased, and the mixed gas (G1+G2) is deposited on the silicon wafer more uniformly; and thereby the doped polycrystalline silicon layers can be formed more uniformly on the surface of the silicon wafer 110.

Up to this point, chemical vapor deposition equipment for solar cells which deposits a silicon deposition gas and impurity gas on the surface of a silicon wafer used as a semiconductor substrate of solar cells has been described.

In what follows, a process for manufacturing solar cells by using deposition equipment of the present invention will be described.

Figure 18:
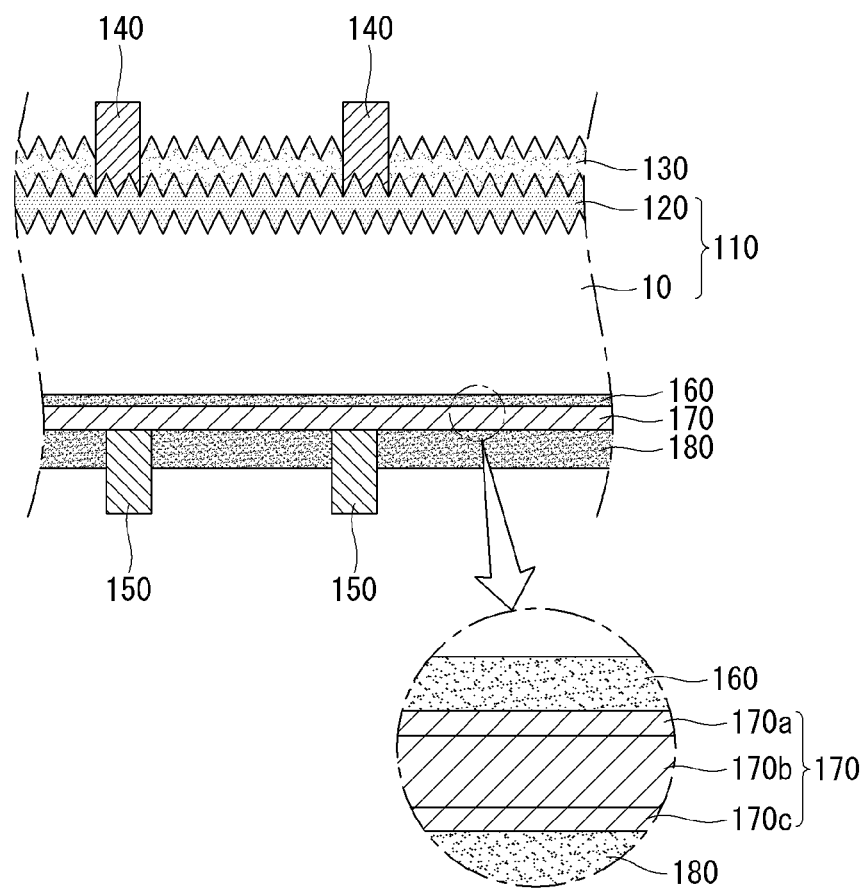
FIG. 18 illustrates one example of a solar cell formed by using deposition equipment of the present invention.
Figure 19:
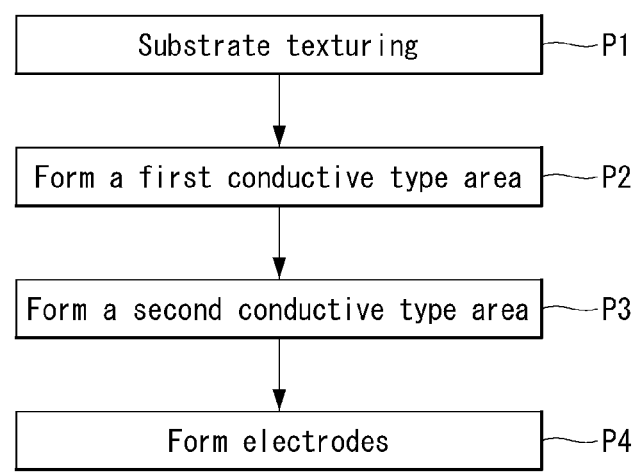
FIG. 19 illustrates one example of a method for manufacturing solar cells of FIG. 18.

FIG. 18 illustrates one example of a solar cell formed by using deposition equipment of the present invention, and FIG. 19 illustrates one example of a method for manufacturing solar cells of FIG. 18.

As shown in FIG. 18, one example of a solar cell manufactured by using deposition equipment of the present invention can comprise a semiconductor substrate 110, control passivation film 160, first conductive area 170, first passivation film 180, second conductive area 120, second passivation film 130, first electrode 150, and second electrode 140.

Here, the control passivation film 160, first passivation film 180, and second passivation film 130 can be omitted, but if they are employed, efficiency of a solar cell can be further improved. Therefore, descriptions will be given with reference to an example employing the three elements.

The semiconductor substrate 110 can be made of crystalline semiconductor. As one example, the semiconductor substrate 110 can be made of monocrystalline silicon wafer or polycrystalline silicon wafer.

In the present embodiment, a separate doping area is not formed in the semiconductor substrate 110, and the semiconductor substrate 110 can be composed of the base area 10 only. However, the present invention is not limited only to the specific example, and it is also possible that the semiconductor substrate 110 is formed by including other doping area in addition to the base area 10.

In what follows, described will be a case where both the base area 10 and the second conductive area 120 are provided in the semiconductor substrate 110.

In the present embodiment, a first or second conductive dopant can be doped with a low doping concentration in the semiconductor substrate 110 or base area 10 which can have a first or second conductive type. At this time, the semiconductor substrate 110 or base area 10 can have a lower doping concentration, higher resistance, or lower carrier concentration than that of one of the first and second conductive areas 170, 120 of the same conductive type.

Examples of p-type dopant used as the first or second conductive dopant can include group 3 elements such as Boron (B), Aluminum (Al), Gallium (Ga), and Indium (In) while examples of n-type dopant can include group 5 elements such as Phosphorus (P), Arsenic (As), Bismuth (Bi), and Antimony (Sb). However, the present invention is not limited to the specific example, and various dopants can be used as the first or second conductive dopant.

The control passivation film 160 can encompass one surface of the semiconductor substrate 110 and be formed by using a dielectric material or silicon material. Basically, the control passivation film 160 can perform the passivation function for one surface of the semiconductor substrate 110. The control passivation film 160 can let the carrier generated from the semiconductor substrate 110 pass, which is not an essential functionality.

The first conductive area 170 can make contact directly to the rear surface of the control passivation film 160 and can be placed over the entire area of the rear surface of the control passivation film 160, where, as one example, the first conductive dopant can be doped with a higher concentration than the semiconductor substrate 110.

As described above, the first conductive area 170 can be formed by including polycrystalline silicon material layer or amorphous silicon layer.

The structure of the first conductive area 170 can further improve the output voltage ($V_{oc}$) of a solar cell, and since the first conductive area 170 is formed while the control passivation film 160 is formed on one surface of the semiconductor substrate 110, thermal damage of the semiconductor substrate 110 can be minimized during a manufacturing process, and high-efficiency solar cells can be realized.

The first conductive area 170 can be composed of a first un-doped polycrystalline silicon layer 170a formed on top of the control passivation film 160, a doped polycrystalline silicon layer 170b on top of the first doped polycrystalline silicon layer 170a, and a second un-doped polycrystalline silicon layer 170c on top of the doped polycrystalline silicon layer 170b.

The first un-doped polycrystalline silicon layer 170a and the second un-doped polycrystalline silicon layer 170c are doped with impurities doped in the doped polycrystalline silicon layer 170b in a heat treatment process for activating doped impurities in the doped polycrystalline silicon layer 170b. However, the amount of the impurity doped in the first un-doped polycrystalline silicon layer 170a and the second un-doped polycrystalline silicon layer 170c is much smaller than the amount of the impurity doped in the doped polycrystalline silicon layer 170b. Therefore, each of the layers 170a and 170c may be defined as an intrinsic polycrystalline silicon layer.

Figure 23:
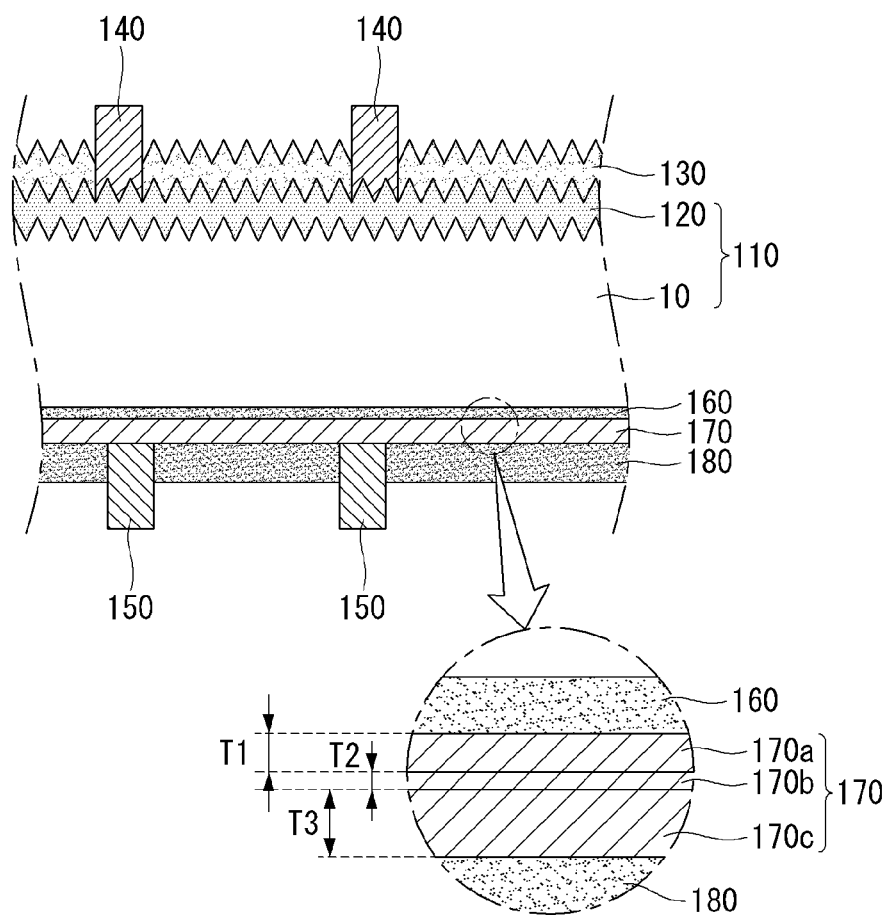
FIG. 23 illustrates another example of a solar cell formed by using deposition equipment of the present invention.

As shown in FIG. 23, a thickness T2 of the doped polycrystalline silicon layer 170b is smaller than a thickness T1 of the first un-doped polycrystalline silicon layer and a thickness T3 of the second un-doped polycrystalline silicon layers, and the thickness T3 of the second un-doped polycrystalline silicon layer is larger than the thickness T1 of the first un-doped polycrystalline silicon layer.

The first passivation film 180 can be placed on the rear surface of the first conductive area 180, namely on the second un-doped polycrystalline silicon layer 170c, can be made of a dielectric material, and can be thicker than the control passivation film 160.

The dielectric material of the first passivation film 180 can include at least one of SiNx, SiOx, SiOxNy, or AlOx which contains a large amount of hydrogen; and can perform the passivation function for the rear surface of the first conductive area 170.

The second conductive area 120 can be placed on the other surface of the semiconductor substrate 110, namely on the front surface and can be formed as the second conductive dopant is diffused into the other surface of the semiconductor substrate 110.

Accordingly, the second conductive area 120 can be formed by using the same silicon material as the semiconductor substrate 110.

The second passivation film 130 can be placed right above the front surface of the second conductive area 120 and can perform the passivation function for the front surface of the second conductive area 120. The second passivation film 130 can be made of a dielectric material containing hydrogen, which can be made of at least one of SiNx, SiOx, SiOxNy, or AlOx, for example.

The second passivation film 130 can be placed on top of the front surface of the passivation film, which improves transmittance of light incident on a solar cell and reduces reflectivity, thereby making the amount of light as much as possible incident on the semiconductor substrate 110.

The first electrode 150 can be placed on one surface, namely rear surface, of the semiconductor substrate 110 and penetrate the first passivation film 180 to be connected to the first conductive type area 170.

The second electrode 140 can be placed on the other surface, namely front surface of the semiconductor substrate 110 and penetrate the second passivation film 130 to be connected to the second conductive area 120.

As shown in FIG. 19, the solar cell of FIG. 18 can be formed by using a manufacturing method which includes a substrate texturing step P1, first conductive type area forming step P2, second conductive area forming step P3, and electrode forming step P4.

The substrate texturing step P1 can apply texture to one of the surfaces of a silicon wafer used as the semiconductor substrate 110, and as shown in FIG. 18, the control passivation layer 160 can be formed on the other surface to which texture is not applied by using Oxidation method or other deposition method. Here, the control passivation layer 160 is not necessarily involved but can be selected optionally; in what follows, however, descriptions will be given with respect to an example where the control passivation layer 160 is employed.

The first conductive type area forming step P2 can form a first conductive area 170 on top of the control passivation layer 160 by using the chemical vapor deposition equipment for solar cells described in FIGS. 1 to 17.

Afterwards, the second conductive area forming step P3 can form a second conductive area 120 by diffusing dopant on the surface of a silicon wafer textured in a heat treatment chamber and used as the semiconductor substrate 110.

Afterwards, the electrode forming step P4 can form a first electrode 150 connected to the first conductive area 170 and a second electrode 140 connected to the second conductive area 120. The first and second electrode 140, 150 can be connected to the first and second conductive type area 170, 120, respectively by using a fire-through method, for example.

Among the individual steps of the method for manufacturing solar cells, deposition equipment of the present invention can be used in the first conductive type area forming step P2, which will be described in more detail below.

Figure 20:
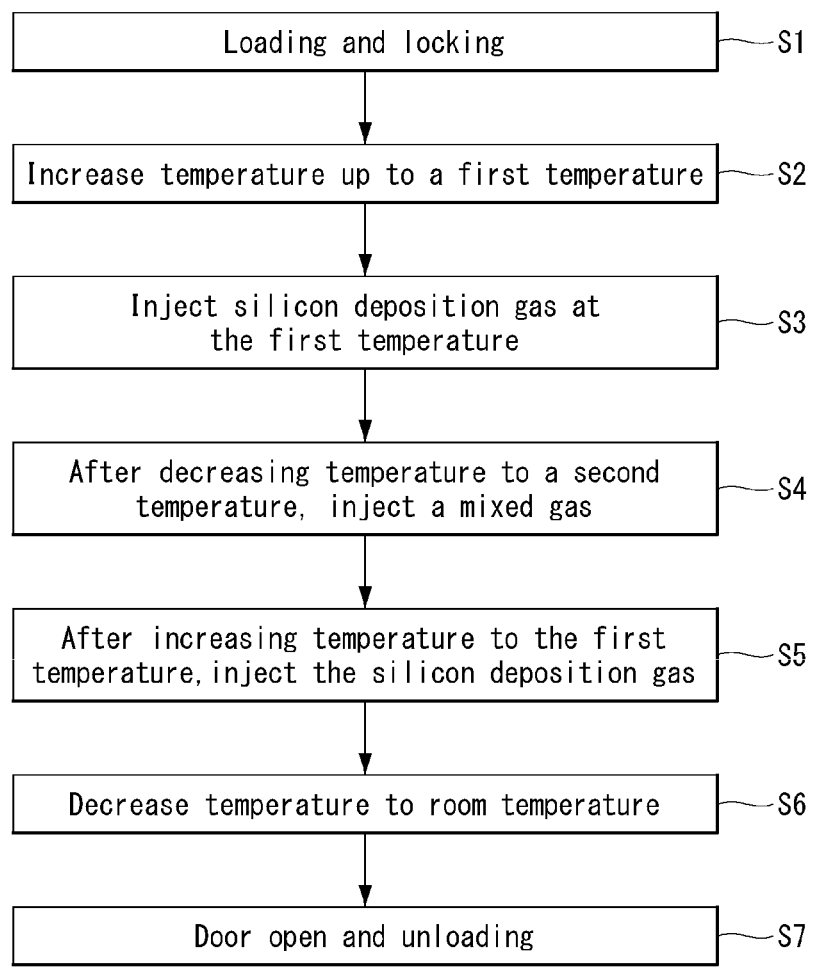
FIG. 20 illustrates a process employing deposition equipment according to one example of the present invention in a process for manufacturing solar cells illustrated in FIG. 19.
Figure 21:
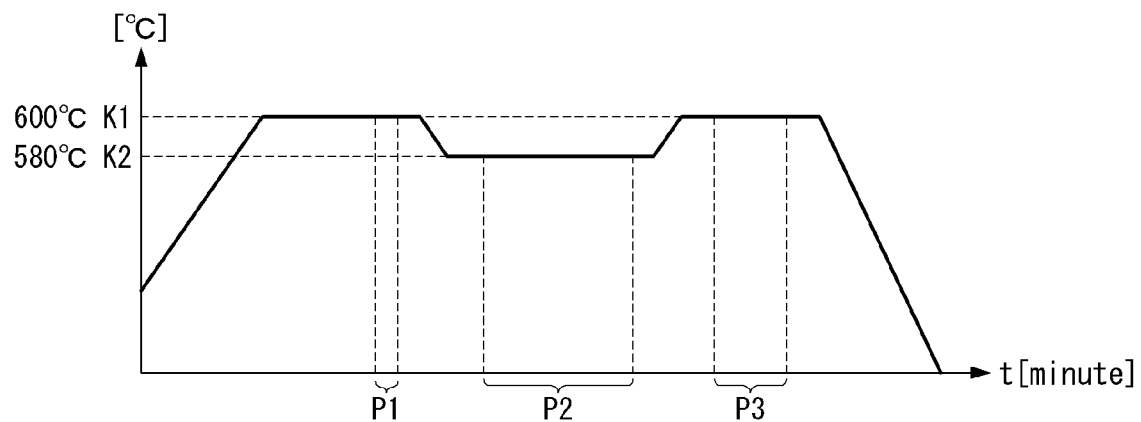
FIG. 21 illustrates a temperature change while deposition equipment according to one example of the present invention is used in a process for manufacturing solar cells.

FIG. 20 illustrates a process employing deposition equipment according to one example of the present invention in a process for manufacturing solar cells illustrated in FIG. 19, and FIG. 21 illustrates a temperature change while deposition equipment according to one example of the present invention is used in a process for manufacturing solar cells.

The first conductive type area forming step P2 described with reference to FIG. 19 can deposit the first conductive area 170 on one surface of a silicon wafer by using chemical vapor deposition equipment for solar cells according to the present invention described with reference to FIGS. 1 to 17.

As described above, the first conductive type area forming step P2 which forms the first conductive area 170 by using chemical vapor deposition equipment can include placing a plurality of silicon wafers vertically in a chamber of the CVD equipment; and depositing an doped polycrystalline silicon layer on each of the plurality of silicon wafers by injecting a mixed gas composed of a silicon deposition gas and an impurity gas from a plurality of shower nozzles toward side edges of the plurality of the silicon wafers.

More specifically, a deposition method of the present invention can include placing a plurality of wafers vertically in a chamber of the CVD equipment; depositing a first un-doped polycrystalline silicon layer on each of the plurality of wafers by injecting a silicon deposition gas from a shower nozzle to side edges of the plurality of wafers; depositing a doped polycrystalline silicon layer on the first un-doped polycrystalline silicon layer by injecting a mixed gas composed of a silicon deposition gas and an impurity gas from a shower nozzle toward side edges of the plurality of wafers; and depositing a second un-doped polycrystalline silicon layer on the doped polycrystalline silicon layer by injecting the silicon deposition gas from the shower nozzle to the side edges of the plurality of wafers.

As described above, the first conductive type area forming step P2 which forms the first conductive area 170 by using chemical vapor deposition equipment can include a process illustrated in FIG. 20, which will be described in more detail below.

First, S1 process disposes a plurality of silicon wafers used for semiconductor substrates in a boat, loads the boat into the inner space of the chamber 10 of the chemical vapor deposition equipment, and locks the door of the chamber 10.

Afterwards, S2 process can increase the internal temperature of the chamber 10 up to a first temperature (K1), S2. Here the first temperature (K1) can range from 590° C. to 610° C. Also, to increase a deposition rate, pressure inside the chamber 10 can be increased to 0.30 Torr to 0.40 Torr.

Afterwards, S3 process can inject a silicon deposition gas (G1) for a first period (P1) while the first temperature is maintained. Accordingly, the first un-doped polycrystalline silicon layer 170a can be deposited on one surface of a silicon wafer. Here, the first period can range from 1 minute to 3 minutes.

Here, the first temperature (K1) is set to range from 590° C. to 610° C. when the first un-doped polycrystalline silicon layer 170a is deposited, which is so intended as to increase a deposition rate of the first un-doped polycrystalline silicon layer 170a and thereby to reduce process time.

The first un-doped polycrystalline silicon layer 170a can be deposited by injecting a silicon deposition gas into the inner space of the chamber through a shower nozzle and the type and flow rate of the gas injected through the shower nozzle can be controlled by a flow rate control unit. The flow rate control unit will be described later.

Afterwards, S4 process can drop the internal temperature of the chamber 10 from the first temperature (K1) to a second temperature (K2) and inject a mixed gas (G1+G2) composed of a silicon deposition gas (G1) and an impurity gas (G2) during a second period (P2) which lasts longer than the first period (P1). Accordingly, a polycrystalline silicon layer 170b containing impurities can be deposited on the first un-doped polycrystalline silicon layer 170a. At this time, the flow rate of the mixed gas injected through the shower nozzle can be controlled by the flow rate control unit.

Here, the ratio of flow rate of the injected silicon deposition gas (G1) to the flow rate of the impurity gas (G2) can range 17:1 to 17:2. In other words, as one example, when flow rate of the silicon deposition gas (G1) is 1700 sccm, the flow rate of the impurity gas (G2) can range from 100 sccm to 200 sccm.

Here, the second period can last 40 minutes to 1 hour. When the mixed gas (G1+G2) is injected, the process temperature is lowered to the second temperature (K2) to improve characteristics of deposition distribution, but deposition rate is slowed down accordingly. Therefore, the deposition process when the mixed gas (G1+G2) is injected is made to be longer than the first period (P1) in order to compensate for the slowed down deposition rate and at the same time, to secure sufficient deposition thickness of the polycrystalline silicon layer 170b.

Here, when the polycrystalline silicon layer 170b is deposited, the mixed gas (G1+G2) is injected at the second temperature (K2) which is lower than the first temperature (K1). This is so intended because when the mixed gas (G1+G2) is injected, the impurity gas (G2) tends to be distributed more uniformly within the silicon deposition gas (G1) at the second temperature (K2), and moreover, when the polycrystalline silicon layer 170b is deposited on the first un-doped polycrystalline silicon layer 170a, not only Silane gas (SiH4), which is the silicon deposition gas (G1), but also the impurity gas (G2) tends to be deposited uniformly on the first un-doped polycrystalline silicon layer 170a at the second temperature (K2).

Here, the second temperature (K2) can range from 575° C. to 585° C.

However, if the second temperature (K2) becomes similar to the first temperature (K1), since Silane (SiH4) gas is excessively well adhered to the first un-doped polycrystalline silicon layer 170a and tends to be agglomerated, the impurity gas (G2) is not uniformly dispersed and distributed but deposited on a specific area with an excessively high doping concentration while being deposited on another specific area with an excessively low doping concentration. However, if the second temperature (K2) ranges from 575° C. to 585° C., the distribution characteristics of the impurity gas (G2) can be further improved.

A thickness T2 of the doped polycrystalline silicon layer is smaller than a thickness T1 of the first un-doped polycrystalline silicon layer.

Afterwards, in the S5 process, after the internal temperature of the chamber 10 can be increased from the second temperature (K2) to the first temperature (K1), the silicon deposition gas (G1) can be injected for a third period (P3) which is longer than the first period (P1) and shorter than the second period (P2). Accordingly, the second un-doped polycrystalline silicon layer 170c can be deposited on the polycrystalline silicon layer 170b. At this time, the third period (P3) can range from 15 minutes to 25 minutes. The S5 process can be optional and can be omitted depending on situations.

A thickness T3 of the second un-doped polycrystalline silicon layer is larger than a thickness T2 of the doped polycrystalline silicon layer and a thickness T1 of the first un-doped polycrystalline silicon layer.

Afterwards, temperature of the chamber 10 can be decreased (S6), door can be opened, and boat can be unloaded.

On the other hand, when the heat treatment process for activating the impurity in the doped polycrystalline silicon layer is performed, the impurities doped in the doped polycrystalline silicon layer can also be doped into the first and second un-doped polycrystalline silicon layers.

Although FIGS. 20 and 21 have described a detailed process of the first conductive type area forming step (P2), FIG. 22 below describes flow rates of the injected silicon deposition gas (G1) and impurity gas (G2) when the mixed gas (G1+G2) is injected, and the polycrystalline silicon layer 170b is deposited.

Figure 22:
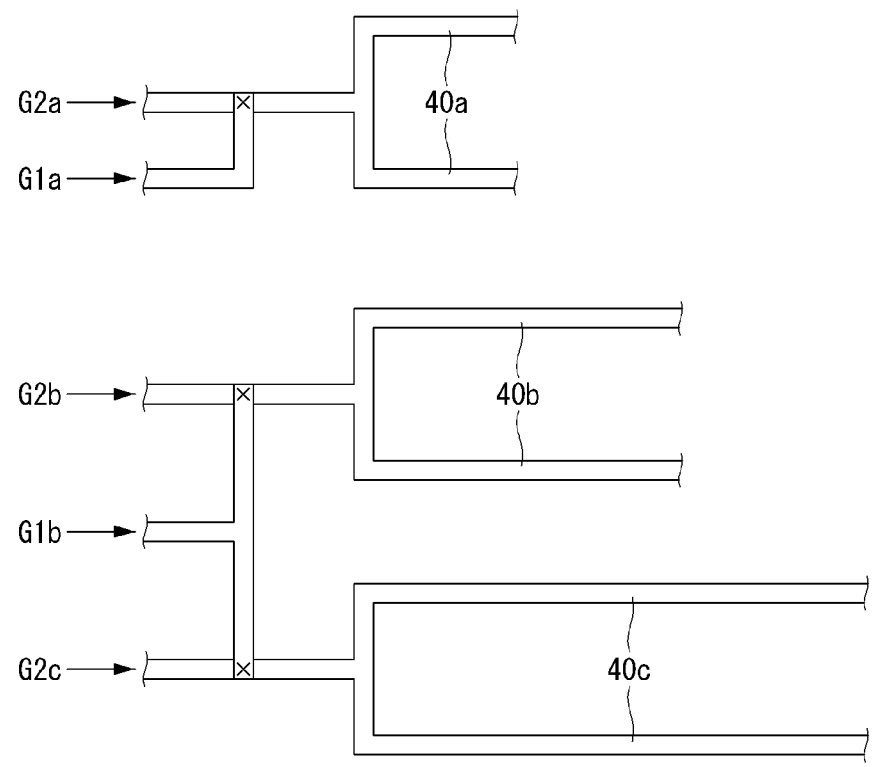
FIG. 22 illustrates flow rates of injected silicon deposition gas and impurity gas when deposition equipment according to one example of the present invention is used in a process for manufacturing solar cells.

FIG. 22 more specifically illustrates flow rates of injected silicon deposition gas and impurity gas when deposition equipment according to one example of the present invention is used in a process for manufacturing solar cells.

Descriptions of FIG. 22 can be applied to an embodiment where a shower nozzle includes a plurality of shower nozzles among various embodiments of chemical vapor deposition equipment for solar cells of the present invention.

As one example, as shown in the seventh embodiment of FIG. 12, when the shower nozzle 40 of chemical vapor deposition equipment has a first sub-shower nozzle 40a, second sub-shower nozzle 40b, and third sub-shower nozzle 40c, a pipe through which the silicon deposition gas (G1) is introduced and a pipe through which the impurity gas (G2) is introduced can be connected together at the entrance of each sub-shower nozzle.

As shown in FIG. 12, the first sub-shower nozzle can be located on the side surface of the front portion of the boat, and the second sub-shower nozzle on the side surface of the central portion of the boat, and the third sub-shower nozzle on the side surface of the rear portion of the boat.

In one example, a silicon pipe (G1a) through which silicon deposition gas (G1) is introduced and a first impurity pipe (G2a) through which impurity gas (G2) is introduced can be connected at the entrance of the first sub-shower nozzle 40a; a second impurity pipe (G2b) and a third impurity pipe (G2c) through which impurity gas (G2) is introduced can be connected respectively to the entrances of the second sub-shower nozzle 40b and the third sub-shower nozzle 40c; and a second silicon pipe (G1b) through which silicon deposition gas (G1) is introduced can be connected commonly to the entrances of the second sub-shower nozzle 40b and the third sub-shower nozzle 40c.

A flow rate control unit (denoted by x in FIG. 22) is disposed at a portion where different pipes are connected to each other. In the step of depositing the doped polycrystalline silicon layer, the flow rate control unit adjusts the flow rate of the silicon deposition gas and the impurity gas so as to mix them at an appropriate ratio, and simultaneously supplies them to the shower nozzle.

Here, the flow rate of silicon deposition gas (G1) introduced through the first silicon pipe (G1a) can be smaller than that of silicon deposition gas (G1) introduced through the second silicon pipe (G1b).

Also, the flow rate of impurity gas (G2) introduced through the second impurity pipe (G2b) can be larger than that of impurity gas (G2) introduced through the first impurity pipe (G1a) and the third impurity pipe (G2c). As one example, when the total amount of flow of impurity gas (G2) through the first, second, and third impurity pipe (G2a, G2b, G2c) ranges 100 to 110 sccm, the flow rate of the impurity gas (G2) introduced through the second impurity pipe (G2b) can be made to range from 40 to 50 sccm, and the flow rate of the impurity gas (G2) introduced through the first impurity pipe (G2a) and the third impurity pipe (G2c) can be made to be 30 sccm or less.

Accordingly, impurity gas (G2) can be distributed more uniformly in the inner space of the chamber 10.

Accordingly, even when positions of silicon wafers disposed within the boat can be different from each other, impurity gas can be uniformly distributed and deposited on each silicon wafer.

In the above, embodiments of the present invention have been described in detail; however, the technical scope of the present invention is not limited to the embodiments, and various modifications and upgrades performed by those skilled in the art by using the basic principles of the present invention defined by the appended claims should also be considered to belong to the technical scope of the present invention.

Chemical vapor deposition equipment for solar cells and a method for driving the equipment according to the present invention, being installed with a shower nozzle injecting a mixed gas composed of a silicon deposition gas and impurity gas, can make thickness of a polycrystalline silicon layer containing impurities deposited on the surface of a semiconductor substrate for solar cells more uniform.

What is claimed is:

1. A chemical vapor deposition (CVD) equipment for depositing a doped polycrystalline silicon layer for a solar cell, the CVD equipment comprising:
    a chamber having an inner space extending in a horizontal direction;
    a boat carrying a plurality of silicon wafers and arranged in the horizontal direction in the inner space of the chamber, the plurality of silicon wafers disposed vertically in the inner space of the chamber;
    at least one first pipe extending in the horizontal direction and disposed to face first side edges of the plurality of silicon wafers;
    at least one second pipe extending in the horizontal direction and disposed to face second side edges of the plurality of silicon wafers opposite the first side edges of the plurality of wafers;
    a door installed at a front side of the chamber along the horizontal direction and through which the boat is able to enter and exit the chamber;
    a vent installed at a rear side of the chamber along the horizontal direction and through which a gas is able to escape; and
    a plurality of shower nozzles each connected to one of the at least one first pipe and at least one second pipe and configured to inject a mixed gas composed of a silicon deposition gas and an impurity gas toward the first and second side edges of the plurality of wafers,
    wherein each of the plurality of shower nozzles has a plurality of holes to inject the mixed gas,
    wherein the at least one first pipe and the at least one second pipe are respectively arranged to inject the mixed gas into a plurality of different silicon wafer groups, and
    wherein the door and the vent face each other in the horizontal direction.

2. The CVD equipment of claim 1, further comprising a flow rate control unit for controlling the flow rate of the silicon deposition gas and the impurity gas, respectively, and supplying the mixed gas to the plurality of shower nozzles.

3. The CVD equipment of claim 2, wherein the flow rate control unit selectively supplies the silicon deposition gas without the impurity gas to the plurality of shower nozzles.

4. The CVD equipment of claim 1, wherein the plurality of shower nozzles are located between a chamber wall and the first or second side edges of the plurality of wafers.

5. The CVD equipment of claim 4, wherein the at least one first pipe and the at least one second pipe extends in the horizontal direction from the outside to the inside of the chamber, and
    wherein the at least one first pipe and the at least one second pipe do not have holes.

6. The CVD equipment of claim 1, wherein the plurality of shower nozzles include a first sub-shower nozzle injecting the mixed gas on a front portion of the boat adjacent to the door;
    a second sub-shower nozzle injecting the mixed gas on a central portion of the boat; and
    a third sub-shower nozzle injecting the mixed gas on a rear portion of the boat adjacent to the vent.

7. A method of depositing a doped polycrystalline silicon layer using a CVD equipment, the method comprising:

placing a plurality of silicon wafers vertically in a chamber of the CVD equipment;

depositing a first un-doped polycrystalline silicon layer by injecting a silicon deposition gas without an impurity gas from a plurality of shower nozzles toward side edges of the plurality of silicon wafers; and depositing a doped polycrystalline silicon layer on the first un-doped polycrystalline silicon layer of each of the plurality of silicon wafers by injecting a mixed gas composed of the silicon deposition gas and the impurity gas from the plurality of shower nozzles toward the side edges of the plurality of silicon wafers, wherein a deposition temperature of the doped polycrystalline silicon layer is lower than a deposition temperature of the first un-doped polycrystalline silicon layer, and wherein a second period to deposit the doped polycrystalline silicon layer is longer than a first period to deposit the first un-doped polycrystalline silicon layer.

8. The method of claim 7, further comprising a heat treatment process for activating impurities of the doped polycrystalline silicon layer, wherein the first un-doped polycrystalline silicon layer is doped with impurities of the doped polycrystalline silicon layer.

9. The method of claim 7, wherein, when the doped polycrystalline silicon layer is deposited, a flow rate of the silicon deposition gas and the impurity gas is adjusted so as to mix the silicon deposition gas and the impurity gas at an appropriate ratio, and the silicon deposition gas and the impurity gas are simultaneously supplied to the plurality of shower nozzles.

10. The method of claim 7, wherein a thickness of the doped polycrystalline silicon layer is smaller than a thickness of the first un-doped polycrystalline silicon layer.

11. The method of claim 7, further comprising;

depositing a second un-doped polycrystalline silicon layer on the doped polycrystalline silicon layer by injecting the silicon deposition gas from the plurality of shower nozzles to the side edges of the plurality of wafers.

* * * * *